(12) United States Patent
Finn

(10) Patent No.: US 10,672,437 B2
(45) Date of Patent: Jun. 2, 2020

(54) LOWER POWER AUTO-ZEROING RECEIVER INCORPORATING CTLE, VGA, AND DFE

(71) Applicant: Integrated Device Technology, Inc., San Jose, CA (US)

(72) Inventor: Steven E. Finn, Chamblee, GA (US)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 16/357,609

(22) Filed: Mar. 19, 2019

(65) Prior Publication Data

US 2019/0296691 A1 Sep. 26, 2019

Related U.S. Application Data

(60) Provisional application No. 62/645,475, filed on Mar. 20, 2018.

(51) Int. Cl.

| | |
|---|---|
| *G11C 7/10* | (2006.01) |
| *H03D 3/00* | (2006.01) |
| *H03G 3/30* | (2006.01) |
| *H03K 5/1536* | (2006.01) |
| *H04L 27/156* | (2006.01) |
| *H04L 25/06* | (2006.01) |
| *G11C 7/22* | (2006.01) |
| *H03G 1/00* | (2006.01) |
| *H03G 1/04* | (2006.01) |
| *H04L 1/20* | (2006.01) |
| *H04L 25/03* | (2006.01) |

(52) U.S. Cl.
CPC .............. *G11C 7/1066* (2013.01); *G11C 7/22* (2013.01); *H03D 3/008* (2013.01); *H03G 1/0029* (2013.01); *H03G 1/04* (2013.01); *H03G 3/3052* (2013.01); *H03K 5/1536* (2013.01); *H04L 1/20* (2013.01); *H04L 25/03885* (2013.01); *H04L 25/069* (2013.01); *H04L 27/1563* (2013.01)

(58) Field of Classification Search
CPC .... H03D 3/008; H03K 5/1536; H04L 25/069; G11C 7/22; G11C 7/1066; G11C 2207/2254; G11C 7/1084; G11C 17/18; G11C 17/165
See application file for complete search history.

(56) References Cited

U.S. PATENT DOCUMENTS

2016/0260499 A1* 9/2016 Walker .................. G11C 16/20

* cited by examiner

*Primary Examiner* — David Lam
(74) *Attorney, Agent, or Firm* — Christopher P. Maiorana, PC

(57) ABSTRACT

An apparatus includes a first half-cell, a second half cell and a multiplexer. The first half-cell may comprise a first input stage configured to present a first input signal to a first auto-zero stage. The second half-cell may comprise a second input stage configured to present a second input signal to a second auto-zero stage. The multiplexer may receive a first output from the first auto-zero stage, receive a second output from the second auto-zero stage and present one of the first output and the second output. The first half-cell and the second half-cell may implement a capacitive coupling. The capacitive coupling may provide a rail-to-rail common-mode input range. The first half-cell and the second half-cell may prevent a mismatch between data signals and clock signals. The first half-cell and the second half-cell may each be configured to implement a calibration when idle.

19 Claims, 14 Drawing Sheets

LOWER POWER AUTO-ZEROING RECEIVER INCORPORATING CTLE, VGA, AND DFE

This application relates to U.S. Provisional Application No. 62/645,475, filed Mar. 20, 2018, which is hereby incorporated by reference in its entirety.

FIELD OF THE INVENTION

The invention relates to memory interfaces generally and, more particularly, to a method and/or apparatus for implementing a lower power auto-zeroing receiver incorporating CTLE, VGA, and DFE.

BACKGROUND

Power consumption is an important metric in conventional double data rate memory modules. A significant portion of the device power is utilized in the receivers. Power consumption for the memory data-path receivers needs to be significantly reduced. Conventional data-path receivers implement brute force analog (i.e., current mode logic (CML)) signal paths to achieve functionality. More recent efforts in the industry try to use current-steering and/or charge-based summation nodes to achieve a decision feedback equalizer (DFE) function. Similarly, these efforts use CML type stages preceding the DFE to achieve continuous time linear equalizer (CTLE) and variable gain amplifier (VGA) functions.

Power consumption is fundamentally limited by wide input common mode, low-mismatch, low-noise, and high-bandwidth requirements. Additionally, receiver circuitry needs to support fast idle-to-active transitions (i.e., <1 ns). Traditionally analog receiver architectures utilize CML type stages which consumes high power and has tradeoffs between headroom, gain, bandwidth, and power. Charge steering or charge summing topologies still require high-power CTLE and VGA prior to the DFE function. Direct sampling approaches require clock amplification that does not lead to significant phase mismatch between data and clock paths (matched paths between clock and data is a predecessor to charge steering, charge-summing DFEs).

It would be desirable to implement a lower power auto-zeroing receiver incorporating CTLE, VGA, and DFE.

SUMMARY

The invention concerns an apparatus includes a first half-cell, a second half cell and a multiplexer. The first half-cell may comprise a first input stage configured to present a first input signal to a first auto-zero stage. The second half-cell may comprise a second input stage configured to present a second input signal to a second auto-zero stage. The multiplexer may receive a first output from the first auto-zero stage, receive a second output from the second auto-zero stage and present one of the first output and the second output. The first half-cell and the second half-cell may implement a capacitive coupling. The capacitive coupling may provide a rail-to-rail common-mode input range. The first half-cell and the second half-cell may prevent a mismatch between data signals and clock signals. The first half-cell and the second half-cell may each be configured to implement a calibration when idle.

BRIEF DESCRIPTION OF THE FIGURES

Embodiments of the invention will be apparent from the following detailed description and the appended claims and drawings in which:

DETAILED DESCRIPTION OF THE EMBODIMENTS

Figure 1:
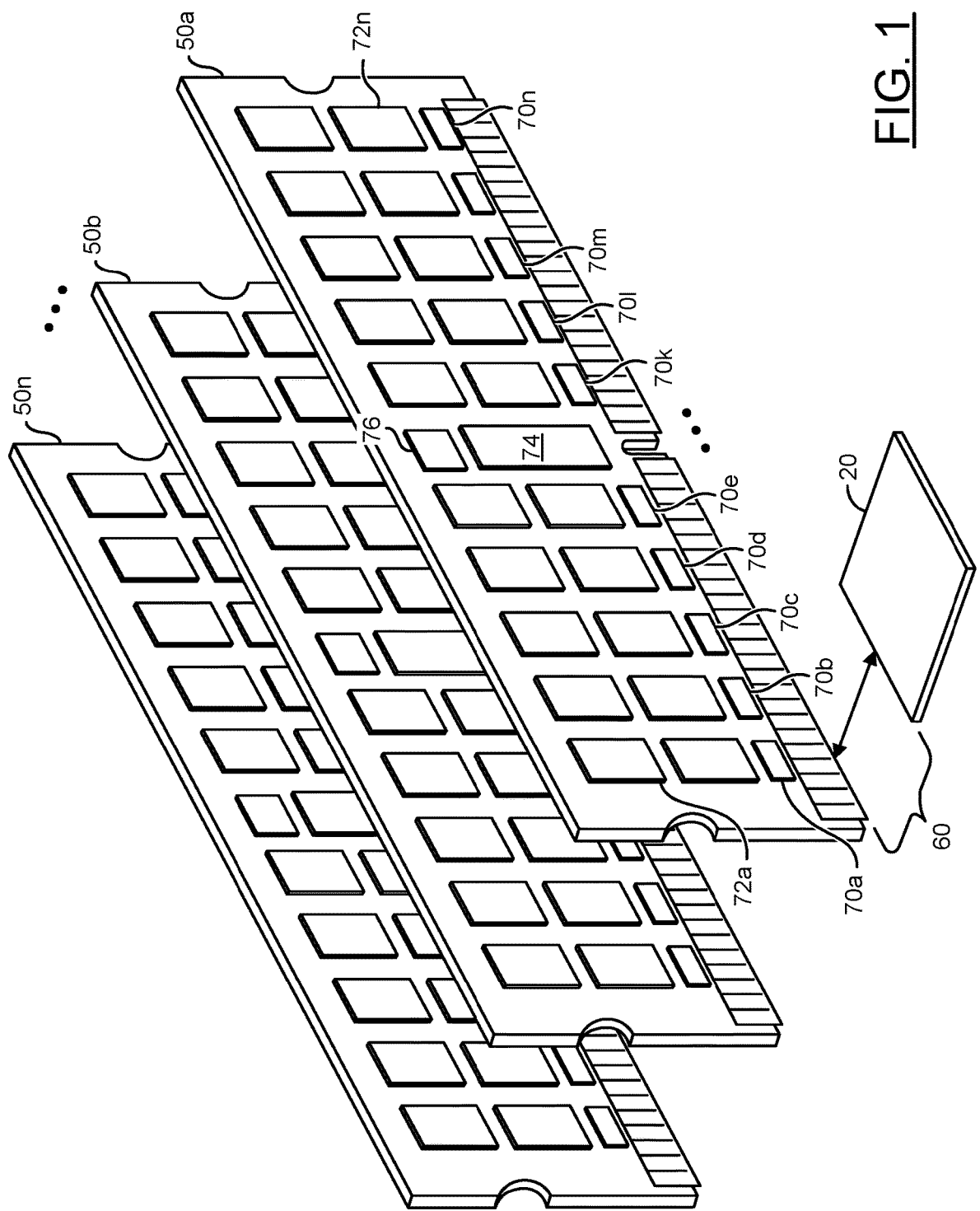
FIG. 1 is a diagram illustrating an example embodiment of a memory system in accordance with an example embodiment of the invention.

Embodiments of the present invention include providing a lower power auto-zeroing receiver incorporating CTLE, VGA, and DFE that may (i) prevent a mismatch between data signals and clock signals, (ii) implement a calibration when idle, (iii) provide capacitive coupling, (iv) provide a rail-to-rail common-mode input range, (v) be implemented instead of trim circuitry, (vi) reduce mismatch to approximately 1 mV, (vii) reduce power consumption, (viii) receive data signals in a memory interface, (ix) receive differential signals in a memory interface and/or (x) be implemented as one or more integrated circuits.

Embodiments of the invention may implement low power data path receivers. In an example, power consumption in the data path may be reduced approximately 4 to 5 times for similar bandwidth compared to CML implementations. Embodiments of the invention may incorporate continuous time linear equalizer (CTLE), variable gain amplifier (VGA) and decision feedback equalizer (DFE) functions. The invention may be further configured to extend an input common-mode range and/or reduce mismatch between clock and data to a point where trim is no longer necessary.

Embodiments of the invention may implement an auto-zeroing technique. The auto-zeroing technique may be used to reduce an effect of mismatch and/or low-frequency noise. In one example, reducing the effect of mismatch and/or low-frequency noise (e.g., compared to an analog and/or CML approach) may facilitate implementations of smaller device sizes. In another example, lower current may be drawn in order to achieve similar bandwidth and/or performance metrics (e.g., compared to higher power consuming implementations that do not implement the auto-zeroing technique such as charge steering and/or charge summing topologies).

The auto-zeroing technique may be implemented using circuitry comprising capacitive coupling. The capacitive coupling nature of auto-zeroing circuitry may be configured to simultaneously incorporate the CTLE, DFE and/or VGA functions into a single summation node. A rail-to-rail common-mode input range may be achieved by the same capacitive coupling.

The auto-zeroing technique may be configured to tune idle-to-active timing and/or idle-power. In an example, idle-to-active timing may be tuned to enable fast transitions (e.g., fast idle-to-active transitions enable receiver circuitry to power-down, which lowers idle power). Idle-to-active timing and/or idle-power may be tuned by leaving one auto-zero half-cell in a calibration phase during an idle mode of operation.

Embodiments of the invention may be configured to support existing phase-matched receivers between data and clock. Mismatch may be reduced to approximately a 1 mV level. Since the invention may eliminate the need for trim, a total size of the die area may be reduced for one-time programmable (OTP) memory. In an example, fast settling (e.g., less than 1 ns) may be achieved with low power. The topology may be scalable and portable to future technology nodes, whereas an analog approach may be hindered by supply voltage reductions.

Referring to FIG. 1, a diagram of a memory system is shown in accordance with an example embodiment of the invention. In various embodiments, the memory system includes a number of circuits $50a$-$50n$. The circuits $50a$-$50n$ may be implemented as memory modules (or boards). In an example, the circuits $50a$-$50n$ may be implemented as dual in-line memory modules (DIMMs). In some embodiments, the circuits $50a$-$50n$ may be implemented as double data rate fourth generation (DDR4) synchronous dynamic random-access memory (SDRAM) modules. In some embodiments, the circuits $50a$-$50n$ may be implemented as double data rate fifth generation (DDR5) SDRAM modules.

In various embodiments, the circuits $50a$-$50n$ may comprise a number of blocks (or circuits) $70a$-$70n$, a number of blocks (or circuits) $72a$-$72n$, a block (or circuit) 74, a block (or circuit) 76 and/or various other blocks, circuits, pins, connectors and/or traces. The circuits $70a$-$70n$ may be configured as data buffers. The circuits $72a$-$72n$ may implement memory devices. In an example, the circuits $72a$-$72n$ may be implemented as synchronous dynamic random-access memory (SDRAM) devices (or chips, or modules). The circuit 74 may be implemented as a registered clock driver (RCD). In an example, the RCD circuit 74 may be implemented as a DDR4 RCD circuit. In another example, the RCD circuit 74 may be implemented as a RCD circuit compliant with the JEDEC specification (e.g., DDR5 standard). For example, in embodiments implementing the circuits $50a$-$50n$ as DDR5 compliant SDRAM modules, the memory modules $50a$-$50n$ may comprise the circuits $72a$-$72n$ arranged in rows of ten SDRAM devices (or chips, or modules), the circuits $70a$-$70n$ arranged in a row corresponding with the circuits $72a$-$72n$, the RCD circuit 74 located so that the circuits $72a$-$72n$ are in groups of five on either of two sides of the RCD circuit 74, and a power management integrated circuit (PMIC) compliant with the JEDEC DDR5 specification. The circuit 76 may be implemented as a power management integrated circuit (PMIC). The type, arrangement and/or number of components of the memory modules $50a$-$50n$ may be varied to meet the design criteria of a particular implementation.

The memory modules $50a$-$50n$ are shown connected to a block (or circuit) 20. The circuit 20 may implement a memory controller and/or host controller. The circuit 20 may be located in another device, such as a computing engine. Various connectors (or pins or traces) 60 may be implemented to connect the memory modules $50a$-$50n$ to the memory controller 20. In some embodiments, the connectors/pins/traces 60 may be a 288-pin configuration. In an example, the memory controller 20 may be a component of a computer motherboard (or main board or host device). In another example, the memory controller 20 may be a component of a microprocessor. In yet another example, the memory controller 20 may be a component of a central processing unit (CPU).

In an example, some of the connectors (or pins or traces) 60 may be part of the memory modules $50a$-$50n$ and some of the connectors/pins/traces 60 may be part of the motherboard and/or memory controller 20. The memory modules $50a$-$50n$ may be connected to the computer motherboard (e.g., by pins, traces and/or connectors 60) to transfer data between components of a computing device and the memory modules $50a$-$50n$. In some embodiments, the connectors/pins/traces 60 may implement an 80-bit bus. In an example, the memory controller 20 may be implemented on a northbridge of the motherboard and/or as a component of a microprocessor (e.g., an Intel CPU, an AMD CPU, an ARM CPU, etc.). The implementation of the memory controller 20 may be varied according to the design criteria of a particular implementation.

In various embodiments, the circuits $50a$-$50n$ may be implemented as DDR4 (or DDR5) SDRAM memory modules. In an example, the circuits $50a$-$50n$ may have a memory module density of 128 gigabyte (GB), one terabyte (TB), or higher per module (e.g., compared to 16 GB per dual in-line memory module (DIMM) in DDR3). In an example embodiment implementing DDR4 compliant SDRAM memory modules, the circuits $50a$-$50n$ may operate at voltages of approximately 1.14 to 1.26 volts (V) (or beyond the range) with a frequency between 800-1600 megahertz (MHz) (or beyond the range) (e.g., compared to 1.35-1.575V at frequencies between 400-1067 MHz in DDR3). In embodiments implementing DDR5 compliant SDRAM memory modules, the circuits $50a$-$50n$ may operate with a frequency of 1.2-3.2 giga-Hertz (GHz) and/or higher frequencies. In embodiments implementing DDR5 standard SDRAM memory modules, there may be 5 memory modules on each side of the RCD 74.

In one example, the circuits $50a$-$50n$ may be implemented as low voltage DDR4 memory modules and operate at approximately 1.05V. For example, in embodiments implementing low voltage DDR4 SDRAM memory modules, the circuits $50a$-$50n$ may implement 35% power savings compared to DDR3 memory. In embodiments implementing DDR4 SDRAM memory modules, the circuits $50a$-$50n$ may transfer data at speeds of about 1.6 to 3.2 giga-transfers per second (GT/s) and higher (e.g., compared to 0.8 to 2.13 GT/s in DDR3). In embodiments implementing DDR5 standard SDRAM memory modules, the circuits $50a$-$50n$ may have a data rate range from 3.2 GT/s to 4.6 GT/s. In an example embodiment implementing DDR5 SDRAM memory modules, the circuits $50a$-$50n$ may operate at up to 8 GT/s. The operating parameters of the memory modules $50a$-$50n$ may be varied according to the design criteria of a particular implementation.

In an example, the memory modules 50a-50n may be compliant with the DDR4 specification entitled "DDR4 SDRAM", specification JESD79-4B, June 2017, published by the Joint Electron Device Engineering Council (JEDEC) Solid State Technology Association, Arlington, Va. Appropriate sections of the DDR4 specification (e.g., the DDR4 JEDEC specification) are hereby incorporated by reference in their entirety. In another example, the memory modules 50a-50n may be implemented according to a fifth generation (DDR5) standard (e.g., for which a standard is currently under development by JEDEC). References to the DDR5 standard may refer to a latest working and/or draft version of the DDR5 specification published and/or distributed to committee members by JEDEC as of March 2019. Appropriate sections of the DDR5 standard are hereby incorporated by reference in their entirety. The JEDEC specification may refer to the DDR4 SDRAM specification, a DDR5 SDRAM specification and/or specifications for future generations of DDR SDRAM.

In some embodiments, the memory modules 50a-50n may be implemented as DDR4 load reduced DIMM (LRDIMM). The data buffers 70a-70n may allow the memory modules 50a-50n to operate at higher bandwidth and/or at higher capacities compared to DDR4 RDIMM (e.g., 2400 or 2666 MT/s for DDR4 LRDIMM compared to 2133 or 2400 MT/s for DDR4 RDIMM at 384 GB capacity). For example, compared to DDR4 RDIMM configurations, the DDR4 LRDIMM configuration of the memory modules 50a-50n may allow improved signal integrity on data signals and/or better intelligence and/or post-buffer awareness by the memory controller 20.

Figure 2:
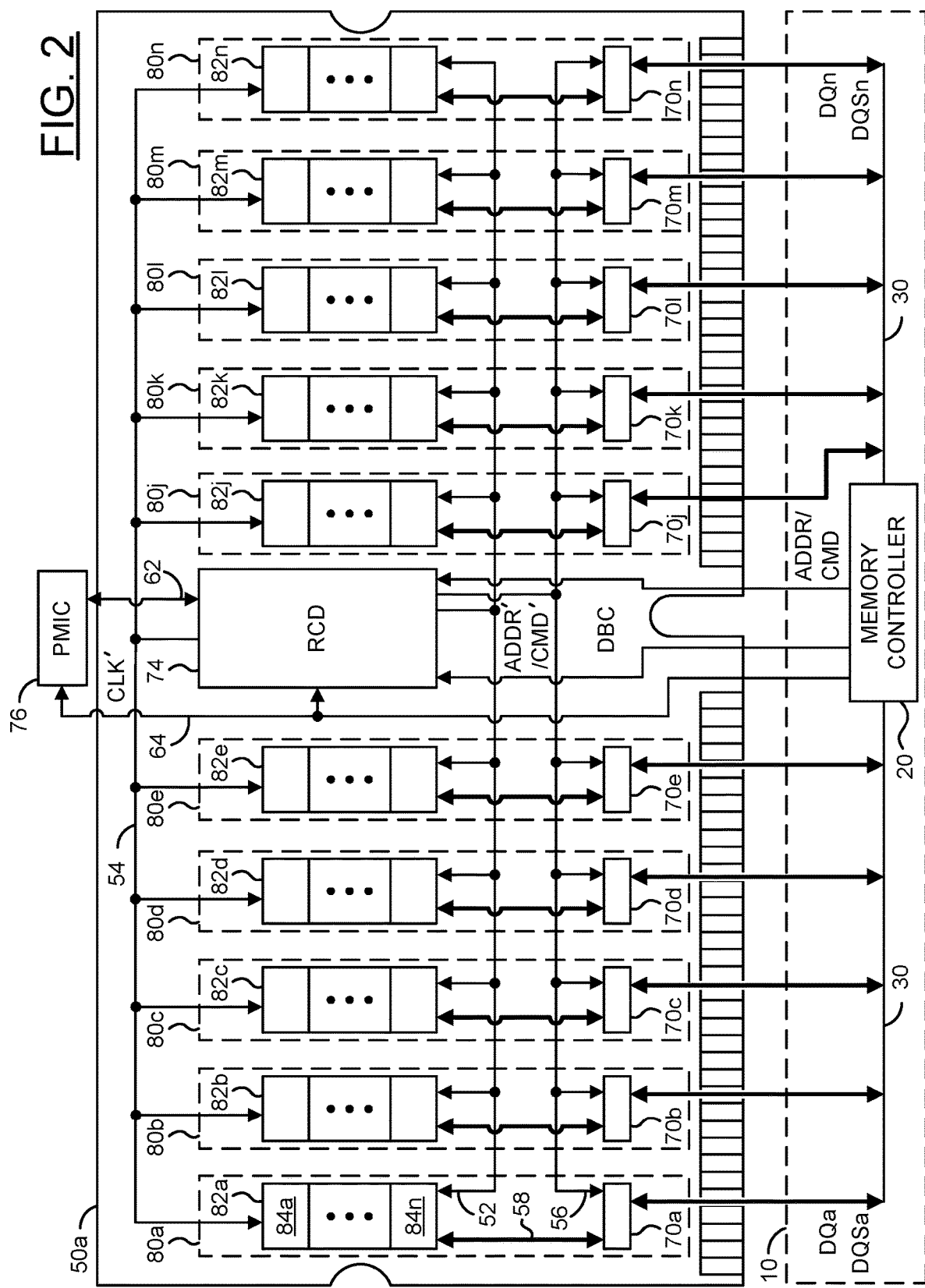
FIG. 2 is a block diagram illustrating a memory module in accordance with an example embodiment of the invention.

Referring to FIG. 2, a block diagram is shown illustrating a memory module 50a of FIG. 1. The memory module 50a may be representative of the memory modules 50b-50n. The memory module 50a is shown communicating with the memory controller 20. The memory controller 20 is shown as part of a block (or circuit) 10. The circuit 10 may be a motherboard (or main board), or other electronic component or computing engine or host device that communicates with the memory module 50a.

The memory module 50a may comprise one or more blocks (or circuits) 80a-80n, the RCD circuit 74 and/or the PMIC 76. The circuits 80a-80n may implement data paths of the memory module 50a. For example, the data path 80a may include a block 82a and/or the data buffer 70a. The data paths 80b-80n may have similar implementations. In the example shown, the memory module 50a may comprise five data paths (e.g., 80a-80e) on one side of the RCD 74 and five data paths (e.g., 80j-80n) on another side of the RCD 74. The circuits 82a-82n may each be implemented as a memory channel. Each of the memory channels 82a-82n may comprise a number of blocks (or circuits) 84a-84n. The circuits 84a-84n may be implemented as random access memory (RAM) chips. For example, the RAM chips 84a-84n may implement a volatile memory such as dynamic RAM (DRAM). The RAM chips 84a-84n may be the SDRAM devices 72a-72n (e.g., the chips 84a-84n may comprise one or more of the circuits 72a-72n located within one of the memory channels 82a-82n). In some embodiments, the RAM chips 84a-84n may be physically located on both sides (e.g., the front and back) of the circuit board of the memory modules 50a-50n. A capacity of memory on the memory module 50a may be varied according to the design criteria of a particular implementation.

The memory controller 20 may generate a clock signal (e.g., CLK), a number of control signals (e.g., ADDR/CMD) and/or a number of commands. The signal CLK and/or the signals ADDR/CMD may be presented to the RCD circuit 74. The commands may be presented to the PMIC 76 via a bus 64. A data bus 30 may be connected between the memory controller 20 and the data paths 80a-80n. The memory controller 20 may generate and/or receive data signals (e.g., DQa-DQn) and data strobe signals (e.g. DQSa-DQSn) that may be presented/received from the data bus 30. Portions of the signals DQa-DQn and DQSa-DQSn may be presented to respective data paths 80a-80n. For example, the signals DQa-DQn may be the DQ signals defined in the JEDEC specification and the signals DQSa-DQSn may be the DQS signals defined in the JEDEC specification. In the example shown, each of the signals DQa-DQn may have a corresponding signal DQSa-DQSn, however in some embodiments, one DQS signal may strobe multiple (e.g., four) DQ signals.

The RCD circuit 74 may be configured to communicate with the memory controller 20, the data buffers 70a-70n, the memory channels 82a-82n and/or the PMIC 76. The RCD circuit 74 may decode instructions (e.g., control words) received from the memory controller 20. For example, the RCD circuit 74 may receive register command words (RCWs). In another example, the RCD circuit 74 may receive buffer control words (BCWs). The RCD circuit 74 may be configured to train the DRAM chips 84a-84n, the data buffers 70a-70n and/or command and address lines between the RCD circuit 74 and the memory controller 20. For example, the RCWs may flow from the memory controller 20 to the RCD circuit 74. The RCWs may be used to configure the RCD circuit 74.

The RCD circuit 74 may be used in both LRDIMM and RDIMM configurations. The RCD circuit 74 may implement a 32-bit 1:2 command/address register. For example, the RCD circuit 74 may have two sets (e.g., A and B) of command/address outputs. The RCD circuit 74 may support an at-speed bus (e.g., a BCOM bus between the RCD circuit 74 and the data buffers 70a-70n). The RCD circuit 74 may implement automatic impedance calibration. The RCD circuit 74 may implement command/address parity checking. The RCD circuit 74 may control register RCW readback. In an example, the RCD circuit 74 may implement a serial communication bus (e.g., a 1 MHz inter-integrated circuit ($I^2C$) bus, etc.). However, other types of management bus protocols (e.g., sideband interface, etc.) may be implemented to meet design criteria of particular implementations. In some embodiments, the RCD circuit 74 may implement a 12.5 MHz inter-integrated circuit ($I^3C$) bus. Inputs to the RCD circuit 74 may be pseudo-differential using external and/or internal reference voltages. The clock outputs, command/address outputs, control outputs and/or data buffer control outputs of the RCD circuit 74 may be enabled in groups and independently driven with different strengths.

The RCD circuit 74 may receive the signal CLK and/or the signals ADDR/CMD from the memory controller 20. Various digital logic components of the RCD circuit 74 may be used to generate signals based on the signal CLK and/or the signals ADDR/CMD and/or other signals (e.g., RCWs). The RCD circuit 74 may also be configured to generate a signal (e.g., CLK') and signals (e.g., ADDR'/CMD'). For example, the signal CLK' may correspond with a signal Y_CLK in the DDR4 specification. The signal CLK' and/or the signals ADDR'/CMD' may be presented to each of the memory channels 82a-82n. In one example, the signals ADDR'/CMD' and CLK' may be transmitted on a common bus 52 and a common bus 54, respectively. In another example, the RCD circuit 74 may implement a single ADDR/CMD input and two ADDR'/CMD' outputs to support a 1:2 command/address architecture. The RCD circuit 74 may generate one or more signals (e.g., DBC). The signals DBC may be presented to the data buffers 70a-70n. The signals DBC may implement data buffer control signals. The signals DBC may be transmitted on a common bus 56 (e.g., a data buffer control bus).

The data buffers 70a-70n may be configured to receive commands and data from the bus 56. The data buffers 70a-70n may be configured to generate/receive data to/from the bus 30. The bus 30 may comprise traces, pins and/or connections between the memory controller 20 and the data buffers 70a-70n. A bus 58 may carry the data between each of the data buffers 70a-70n and respective memory channels 82a-82n. The data buffers 70a-70n may be configured to buffer data on the buses 30 and 58 for write operations (e.g., data transfers from the memory controller 20 to the corresponding memory channels 82a-82n). The data buffers 70a-70n may be configured to buffer data on the buses 30 and 58 for read operations (e.g., data transfers from the corresponding memory channels 82a-82n to the memory controller 20).

The data buffers 70a-70n may exchange data with the DRAM chips 84a-84n in small units (e.g., 4-bit nibbles for x4 DRAMS or 8-bit bytes for x8 DRAMs). In various embodiments, the DRAM chips 84a-84n may be arranged in multiple (e.g., two) sets. For two set/two DRAM chip (e.g., 84a-84b) implementations, each set may contain a single DRAM chip (e.g., 84a or 84b). Each DRAM chip 84a-84b may be connected to the respective data buffers 70a-70n through an upper nibble and a lower nibble, or a byte. For two set/four DRAM chip (e.g., 84a-84d) implementations, each set may contain two DRAM chips (e.g., 84a-84b or 84c-84d). A first set may be connected to the respective data buffers 70a-70n through the upper nibble. The other set may be connected to the respective data buffers 70a-70n through the lower nibble. For two set/eight DRAM chip (e.g., 84a-84h) implementations, each set may contain four of the DRAM chips 84a-84h. A set of four DRAM chips (e.g., 84a-84d) may connect to the respective data buffers 70a-70n through the upper nibble. The other set of four DRAM chips (e.g., 84e-84h) may connect to the respective data buffers 70a-70n through the lower nibble. Other numbers of sets, other numbers of DRAM chips, and other data unit sizes may be implemented to meet the design criteria of a particular implementation.

The DDR4 LRDIMM configuration may reduce a number of data loads to improve signal integrity on a data bus (e.g., the bus 30) of the memory module from a maximum of several (e.g., four) data loads down to a single data load. The distributed data buffers 70a-70n may allow DDR4 LRDIMM designs to implement shorter I/O trace lengths compared to DDR3 LRDIMM designs, which use a centralized memory buffer. For example, shorter stubs connected to the memory channels 82a-82n may result in less pronounced signal reflections (e.g., improved signal integrity). In another example, the shorter traces may result in a reduction in latency (e.g., approximately 1.2 nanoseconds (ns), which is 50% less latency than DDR3 buffer memory). In yet another example, the shorter traces may reduce I/O bus turnaround time. For example, without the distributed data buffers 70a-70n (e.g., in DDR3 memory applications) traces would be routed to a centrally located memory buffer, increasing trace lengths up to six inches compared to the DDR4 LRDIMM implementation shown in FIG. 2.

In some embodiments, the DDR4 LRDIMM configuration may implement nine of the data buffers 70a-70n. The memory modules 50a-50n may implement 2 millimeter (mm) frontside bus traces and backside traces (e.g., the connectors/pins/traces 60). A propagation delay through the data buffers 70a-70n may be 33% faster than through a DDR3 memory buffer (e.g., resulting in reduced latency). In some embodiments, the data buffers 70a-70n may be smaller (e.g., a reduced area parameter) than a data buffer used for DDR3 applications.

An interface 62 is shown. The interface 62 may be configured to enable communication between the RCD circuit 74 and the PMIC 76. For example, the interface 62 may implement a register clock driver/power management integrated circuit interface (e.g., a RCD-PMIC interface). The interface 62 may comprise one or more signals and/or connections. Some of the signals and/or connections implemented by the interface 62 may be unidirectional. Some of the signals and/or connections implemented by the interface 62 may be bidirectional. The interface 62 may be enabled by the host memory controller 20. In one example, the memory controller may enable the interface 62 for the RCD using the signal ADDR/CMD. In another example, the memory controller 20 may enable the interface 62 for the PMIC 76 by presenting an enable command.

The bus 64 may be implemented as a host interface bus. The host interface bus 64 may be bi-directional. The host interface bus 64 may be configured to communicate commands and/or other data to the PMIC 76 and/or other components of the memory module 50a. In some embodiments, the bus 64 may communicate with the RCD 74. In some embodiments, the host interface bus 64 may implement an I²C protocol. In some embodiments, the host interface bus 64 may implement an I³C protocol. The protocol implemented by the host interface 64 may be varied according to the design criteria of a particular implementation.

Figure 3:
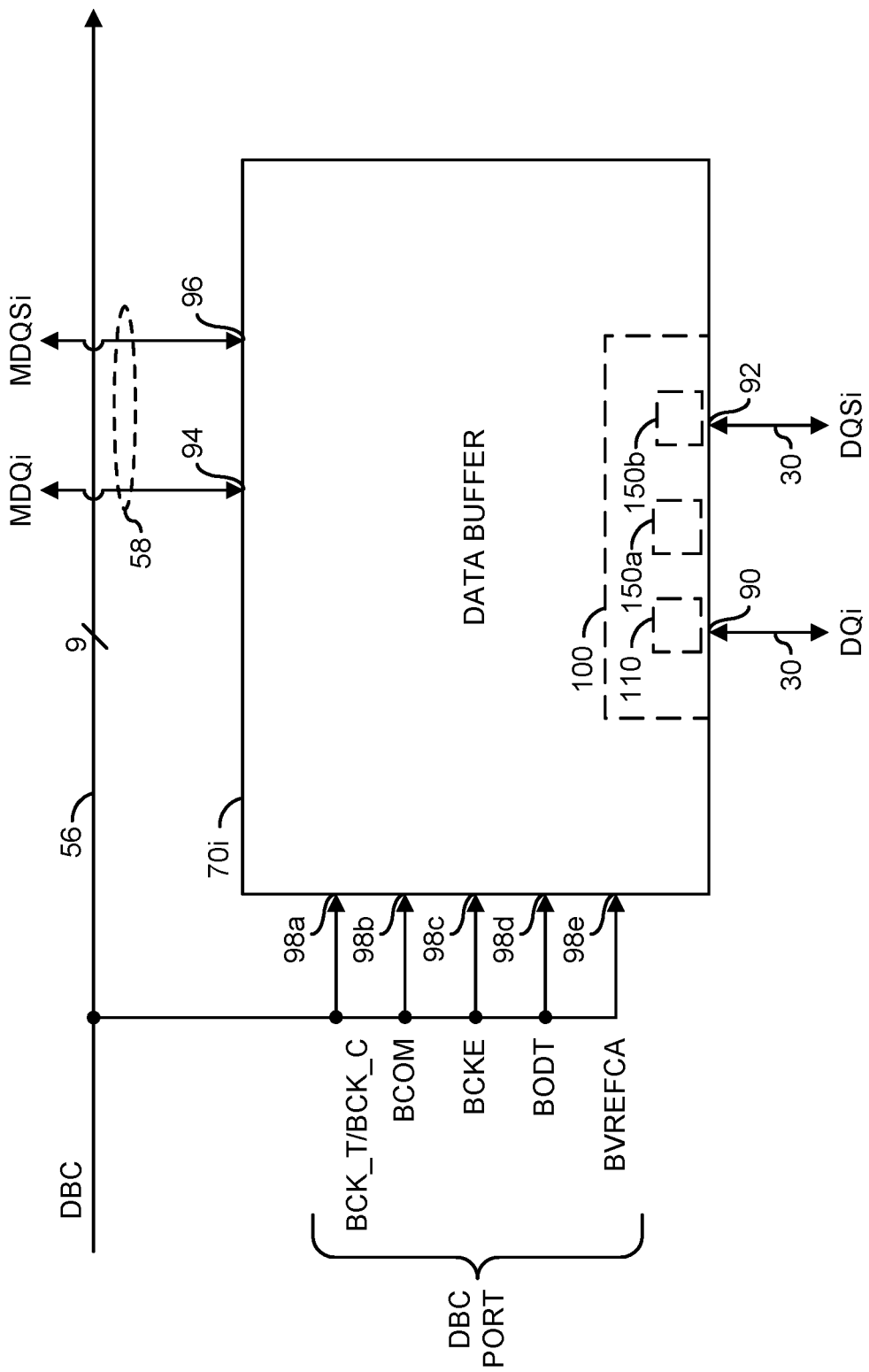
FIG. 3 is a block diagram illustrating a data buffer in accordance with an example embodiment of the invention.

Referring to FIG. 3, a diagram is shown illustrating a data buffer 70i in accordance with an example embodiment of the invention. The data buffer 70i may be representative of an example embodiment of the data buffers 70a-70n. The data buffer 70i is shown having a first input/output 90, a second input/output 92, a third input/output 94, and a fourth input/output 96.

The first input/output 90 is configured for presenting/receiving the signals DQi (e.g., the data signals DQ corresponding to a memory channel) between the data buffer 70i and the controller 20. The second input/output 92 is configured for presenting/receiving the signals DQSi (e.g., the data strobe signals DQS corresponding to the memory channel) between the data buffer 70i and the controller 20. The third input/output 94 is configured for presenting/receiving the signals DQi as memory input/output signals (e.g., MDQi) corresponding to a memory channel between the data buffer 70i and the respective memory devices (e.g., DRAM chips) 72a-72n. The fourth input/output 96 is configured for presenting/receiving the signals DQSi as memory input/output signals (e.g., MDQSi) corresponding to a memory channel between the data buffer 70i and the respective memory devices (e.g., DRAM chips) 72a-72n.

The signals MDQi and/or MDQSi are generally transmitted between the memory modules 72a-72n and the respective data buffers 70a-70n. In an example, data (e.g., the signals DQi) and/or a data strobe (e.g., the signal DQSi) from the memory controller 20 may be presented to the data buffer 70i, buffered in the data buffer 70i, then transmitted to the respective memory device(s) 72a-72n. In another example, data from the respective memory device(s) 72a-72n (e.g., MDQi) and/or a data strobe (e.g., the signal MDQSi) may be presented to the data buffer 70i, buffered in the data buffer 70i, and then transmitted on an appropriate memory channel to the memory controller 20.

The data buffer 70i is shown also receiving signals (e.g., DBC) from the bus 56 at a control port (e.g., DBC PORT). The signals DBC may be presented to the data buffers 70a-70n (e.g., using the data buffer control bus 56). In an example, the signals DBC are illustrated comprising five signals transmitted over 9 pins/bits (e.g., a pair of signals BCK_T/BCK_C, a signal BCOM, a signal BCKE, a signal BODT and/or a signal BVREFCA). However, other numbers of pins/bits may be implemented accordingly to meet the design criteria of a particular application. The control port of the data buffer 70i is shown having an input 98a receiving the signals BCK_T/BCK_C, an input 98b receiving the signal BCOM, an input 98c receiving the signal BCKE, an input 98d receiving the signal BODT, and an input 98e receiving the signal BVREFCA. In various embodiments, the signals BCK_T/BCK_C may be implemented as a 2-bit signal representing a differential (e.g., true (T) and complementary (C) versions) clock signal for the duplex data buffers 70a-70n. In an example, the signals BCK_T/BCK_C may represent a system clock. In various embodiments, the signal BCOM may be implemented as a 4-bit signal representing data buffer commands. However, other numbers of bits may be implemented accordingly to meet the design criteria of a particular application. The signal BCOM may be implemented as a unidirectional signal from the RCD circuit 74 to the data buffers 70a-70n. In an example, the signal BCOM may be implemented at a single data rate (e.g., 1 bit per signal per clock cycle). However, a particular command may take a different number of clock cycles to transfer information. The signal BCKE may be a function registered dedicated non-encoded signal (e.g., DCKE). The signal BODT may be a function registered dedicated non-encoded signal (e.g., DODT). The signal BVREFCA may be a reference voltage for use with pseudo-differential command and control signals.

The data buffers 70a-70n may receive a set of data buffer commands (e.g., for writing buffer control words (BCWs)) from the signals DBC. The buffer control words may be used to customize operation of the data buffers 70a-70n. The buffer control words may flow from the memory controller 20, through the RCD circuit 74, to the data buffers 70a-70n. The buffer control words may be similar to register control words (RCWS) used for configuring the RCD circuit 74. Similar to commands for writing the register control words, the commands for writing the buffer control words may look like an MRS7 command, where the address lines are really the payload.

In embodiments where the bus 56 comprises nine pins, the RCD circuit 74 may do more than pass a buffer control word directly through to the data buffers 70a-70n. In one example, the RCD circuit 74 may convert (e.g., multiplex) an MRS7 command format into a buffer control word in a BCOM format. The RCD circuit 74 may map the 12 address bits of the MRS7 command into five separate data transfers, each 4 bits wide. The five data transfers may be set up back to back over the bus 56. For example, 5 clock cycles plus a parity cycle may be used to complete the buffer command in the buffer control word. Once the buffer control word reaches the data buffers 70a-70n, the data buffers 70a-70n may decode the buffer control word, write the buffer control word to a function space of the data buffer, and complete the buffer command in the buffer control word.

A function of the signal BCOM may be to transmit the buffer control words. However, compliant with the JEDEC specification for DDR4 SDRAM and/or the DDR5 standard, the RCD circuit 74 may send all read/write commands and MRS information over the bus 56 (e.g., to allow the data buffers 70a-70n to keep track of what the memory devices 72 are doing). In some embodiments, different buffer commands may take a different number of cycles to transfer the information.

The RCD circuit 74 may receive an MRS7 command from the memory controller 20 (e.g., from a host). For example, a host may want to change a parameter (e.g., typically on initialization or boot up of a computing device). The RCD circuit 74 may check the MRS7 command to determine whether the address bit 12 is set to 1 (e.g., a logical one). In an example, when an address bit 12 of the MRS7 command is set to 1, the RCD circuit 74 may recognize the command as a buffer command (e.g., a command that is not meant for the RCD circuit 74). The RCD circuit 74 may convert the command from the memory controller 20 to a buffer control word and send the buffer control word to the data buffers 70a-70n via the bus 56. The data buffers 70a-70n may write the buffer control word to a function space to complete the command.

The data buffers 70a-70n may be configurable. The buffer commands may allow the memory controller 20 to customize aspects of termination (e.g., ODT), signal strength on the DQ lines, and/or events (e.g., receiver timing, driver timing, etc.) in both directions (e.g., for both read and write operations). In some embodiments, some of the configurations of the data buffers 70a-70n may be decided based on system level configurations. Generally, most of the configuration of the data buffers 70a-70n may be decided during training steps. During training steps, host controllers (e.g., the memory controller 20) may test and compare results of various training steps to determine an optimal configuration.

In various embodiments, the bus 56 may be used to send commands/data to program configuration registers of the data buffers 70a-70n. The bus 56 may also send commands (e.g., data reads and/or data writes) that control data traffic through the data buffers 70a-70n. For example, some commands may optimize power consumption and noise filtering (e.g., equalization) of the data buffers 70a-70n. In another example, read/write delays may be added per data line.

The data buffers 70a-70n may implement dual multi-bit (e.g., 4-bit) bidirectional data registers with differential data strobes (e.g., DQS_T/DQS_C). The data buffers 70a-70n may implement automatic impedance calibration. The data buffers 70a-70n may implement BCOM parity checking. The data buffers 70a-70n may implement control register (e.g., buffer control word) readback.

In some embodiments, the data buffers 70a-70n may each comprise a block (or circuit or module or apparatus) 100. The circuit 100 may be implemented in one or more of the data buffers 70a-70n. The circuit 100 may implement a receiver to enable a data path structure configured to implement the auto-zeroing technique. In an example, the apparatus 100 may implement capacitive coupling for the auto-zeroing circuitry to simultaneously incorporate the CTLE, DFE and/or VGA functions into a single summation node. The apparatus 100 may tune idle-to-active timing for efficient power usage. For example, tuning the idle-to-active timing may reduce power compared to implementations that do not implement the auto-zeroing of the apparatus 100.

The circuit 100 may comprise a block (or circuit) 110 and/or blocks (or circuits) 150a-150b. The circuit 110 may implement a clock generator. The circuits 150a-150b may each implement a half-cell. The circuit 100 may comprise other components (not shown). The number, type and/or arrangement of the components of the circuit 100 may be varied according to the design criteria of a particular implementation.

In some embodiments, the apparatus 100 generally receives write data in the signal DQi through the input/output 90 and transfers the write data to the signal MDQi at the input/output 94. The apparatus 100 may also receive read data through the signal MDQi that is transferred to the signal DQi. The apparatus 100 may receive write synchronization information in the signal DQSi via the input/output 92. The apparatus 100 may also receive read synchronization information in the signal MDQSi via the input/output 96. In some embodiments, the apparatus 100 may be operational to provide communications with the data buffer 70i via the DBC port (e.g., the inputs 98a-98e). Logic modules implemented by the apparatus 100 may be configured to control operations of the data buffer 70i based upon commands received via the DBC port.

Figure 4:
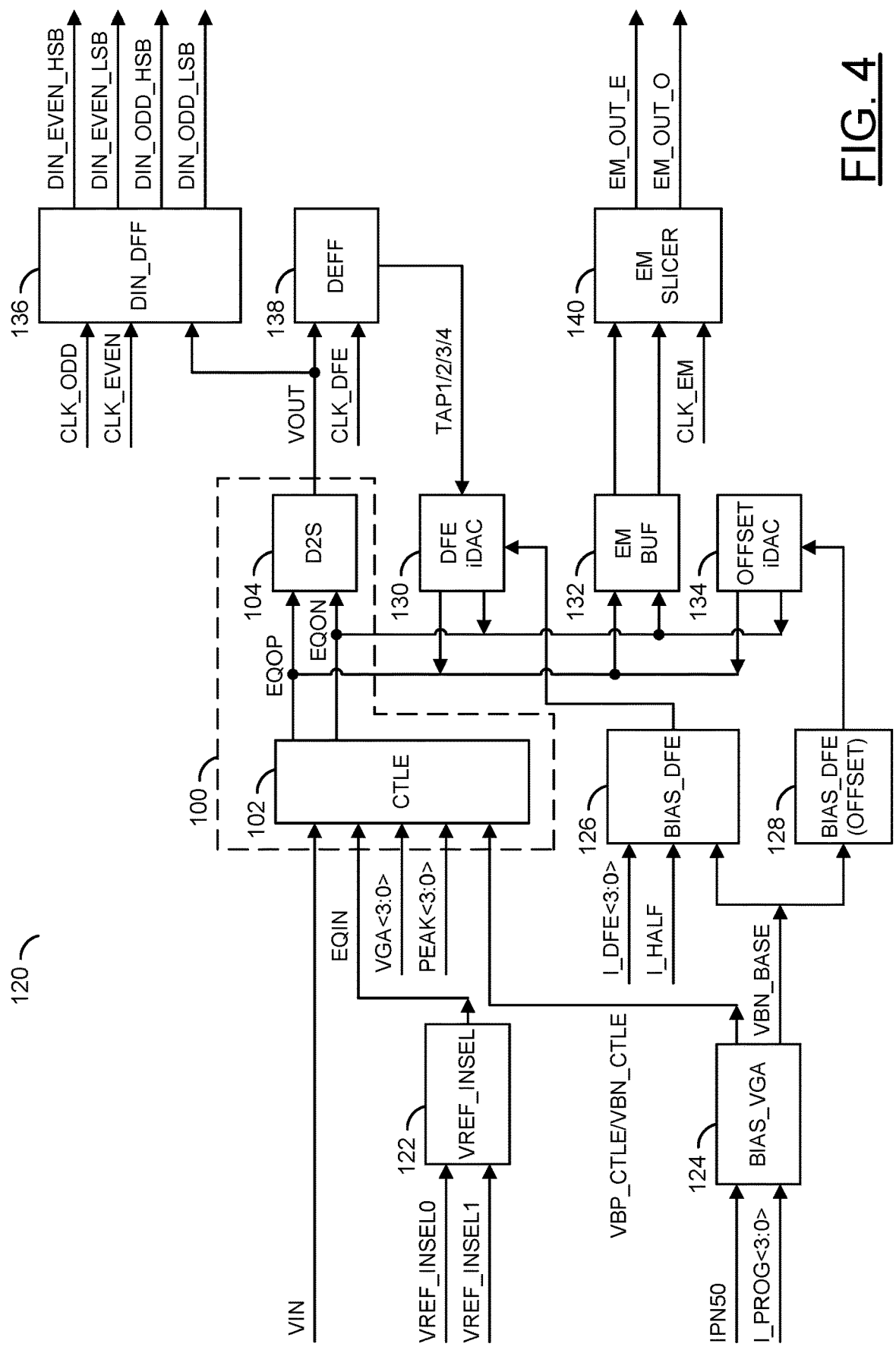
FIG. 4 is a diagram illustrating a receiver data path for data signals in accordance with an example embodiment of the invention.

Referring to FIG. 4, a diagram illustrating an example receiver data path 120 for data signals is shown in accordance with an example embodiment of the invention. In various embodiments, the data path 120 may be a receiver structure of the RCD 74. In other embodiments, the data path 120 may be part of the data buffers 70a-70n.

The data path 120 may comprise the apparatus 100. The apparatus 100 may comprise a block (or circuit) 102 and/or a block (or circuit) 104. The circuit 102 may implement a CTLE module. The circuit 104 may implement a D2S module. The apparatus 100 may comprise additional components and/or logic (not shown). The number, type and/or arrangement of the apparatus 100 may be varied according to the design criteria of a particular implementation.

The receiver data path 120 may further comprise a block (or circuit) 122, a block (or circuit) 124, a block (or circuit) 126, a block (or circuit) 128, a block (or circuit) 130, a block (or circuit) 132, a block (or circuit) 134, a block (or circuit), a block (or circuit) 136, a block (or circuit) 138 and/or a block (or circuit) 140. The circuit 122 may implement a VREF_INSEL module (e.g., a reference voltage module). The circuit 124 may implement a BIAS_VGA module. The circuit 126 may implement a BIAS_DFE module. The circuit 128 may implement a BIAS_DFE offset module. The circuit 130 may implement a DFE iDAC module. The circuit 132 may implement an eye monitor (EM) buffer module. The circuit 134 may implement an offset iDAC module. The circuit 136 may implement a flip-flop circuit (e.g., a DFF module). The circuit 138 may implement a DEFF module. The circuit 140 may implement an EM slicer module. The circuits 122-140 may perform various functions (e.g., calculate decision feedback equalizer values) for the receiver data path 120. The receiver data path 120 may comprise other components (not shown). In some embodiments, the apparatus 100 may further comprise one or more of the modules 122-140. The type, number, arrangement and/or functionality of the components of the data path 120 may be varied according to the design criteria of a particular implementation.

Generally, the input data is transmitted through the data path 120 via the cascading arrangement of the CTLE module 102, the D2S module 104 and the DFF module 136. The data may be sampled by one or more clocks in the DFF module 136. In the example shown, the data path 120 may receive a signal (e.g., VIN). The signal VIN may be a data input to the apparatus 100 (e.g., at the CTLE module 102). In some embodiments, the signal VIN may be an EQIP signal comprising an IBT (e.g., input bus termination) value and/or a gain value. In an example, the signal VIN may be a voltage representing input data (e.g., the data input to the RCD 74 and/or the data buffers 70a-70n).

The apparatus 100 may receive the input signal VIN, a reference signal (e.g., EQIN), an input signal (e.g., VGA<3:0>), an input signal (e.g., PEAK<3:0>) and a pair of input signals (e.g., VBP_CTLE/VBN_CTLE). The signal VGA<3:0>, the signal PEAK<3:0> and/or the signals VBP_CTLE/VBN_CTLE may be received by the CTLE module 102. The reference voltage module 122 may receive an input signal (e.g., VREF_INSEL0) and/or an input signal (e.g., VREF_INSEL1). The reference voltage module 122 may generate the signal EQIN. The number, type and/or arrangement of the input signals to the apparatus 100 may be varied according to the design criteria of a particular implementation.

The CTLE module 102 may receive the signal EQIP, the signal EQIN, the signal VGA, the signal PEAK and/or the signals VBP_CTLE/VBN_CTLE. The signal VGA and/or the signal PEAK may be digital control signals used by the CTLE module 102. For example, the CTLE module 102 may be configured to select a gain value in response to the signal VGA and signal EQIP. The signals VBP_CTLE/VBN_CTLE may be generated by the BIAS_VGA module 124. For example, the BIAS_VGA module 124 may output one or more bias voltages for continuous-time linear equalization. The overall gain of the data path 120 may be generated in response to the signals VGA (e.g., to program the gain of the CTLE module 102) and the signal PEAK. In an example, the signal PEAK may be used to provide different AC peaking to compensate for channel loss. Generally, the peaking is preferred to be similar under different gain settings.

The reference voltage module 122 may comprise a voltage multiplexer configured to select a suitable reference voltage. For example, the voltage multiplexer of the reference voltage module 122 may select the reference voltage from the signal VREF_INSEL0 and/or the signal VREF_INSEL1. In one example, the signal EQIN may be one of the signal VREF_INSEL0 or the signal VREF_INSEL1.

The apparatus 100 may generate a signal (e.g., EQOP) and a signal (e.g., EQON). The signal EQOP and the signal EQON may be generated by the CTLE module 104. The signal EQOP and the signal EQON may be differential signals. The signal EQOP and the signal EQON may be presented as input differential signals for the D2S module 104.

The D2S module 104 may present a signal (e.g., VOUT) in response to the signal EQOP and the signal EQON. The signal VOUT may be presented to the DEFF module 138 and/or the DFF module 136. The signal VOUT may be a single-ended signal generated by the D2S module 104 in response to the input differential signals EQOP and EQON generated by the CTLE module 102. The D2S module 104 may compare a voltage of the differential signals EQOP and EQON. For example, the signal VOUT may be a logical high value when the voltage of the signal EQOP is larger than the voltage of the signal EQON. In another example, the signal VOUT may be a logical low value when the voltage of the signal EQOP is less than the voltage of the signal EQON.

The DFF module 136 may receive clock inputs (e.g., a signal CLK_ODD and a signal CLK_EVEN). In an example, the signal CLK_ODD and the signal CLK_EVEN may each be a component of the signal CLK received by the RCD 74. The DFF module 136 may comprise a group of delay flip-flops with different clocks (e.g., CLK_ODD/CLK_EVEN). The DFF module 136 may present an output of the data path 120. For example, the clock input may be used to sample the data signal VOUT. The DFF module 136 may generate a signal (e.g., DIN_EVEN_HSB), a signal (e.g., DIN_EVEN_LSB), a signal (e.g., DIN_ODD_HSB) and/or a signal (e.g., DIN_ODD_LSB). For example, the signal DIN_EVEN_HSB and the signal DIN_EVEN_LSB may be data sampled on even clock signals and the signal DIN_ODD_HSB and the signal DIN_ODD_LSB may be data sampled on odd clock signals.

The CTLE module 102 and/or the reference voltage module 122 may work together to realize the wide programmable DC gain of the receiver. The CTLE module 102 may comprise one input branch in order to implement a 0 decibels (dB) to +6 dB gain range with a 2 dB least significant bit (LSB). The input branch implemented by the CTLE module 102 may relieve capacitive loading at the output of the CTLE module 102.

Figure 5:
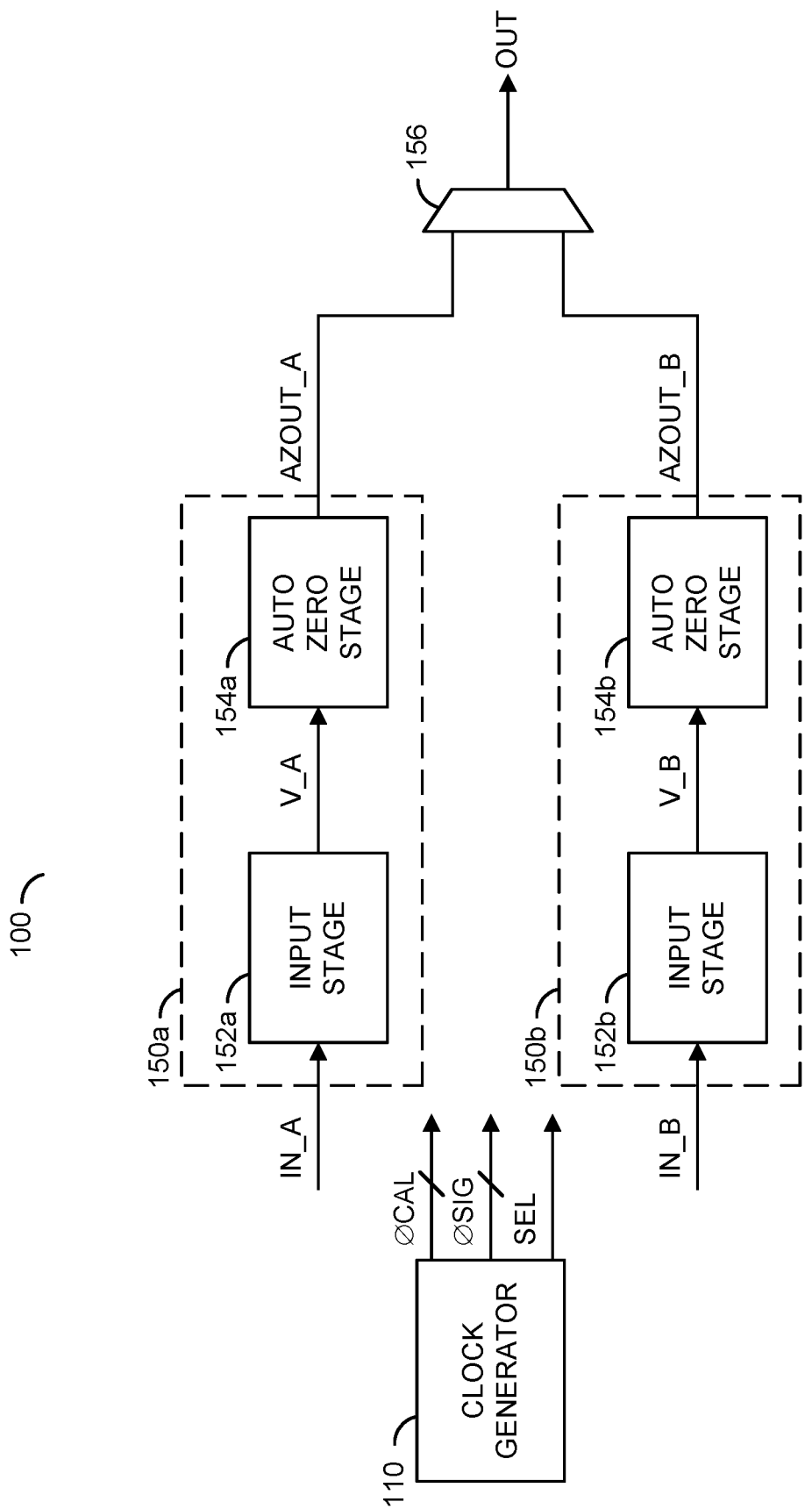
FIG. 5 is a block diagram illustrating an example embodiment of the invention.

Referring to FIG. 5, a block diagram of the apparatus 100 is shown in accordance with an embodiment of the invention. The apparatus 100 may comprise the clock generator 110, the half-cells 150a-150b, blocks (or circuits) 152a-152b, blocks (or circuits) 154a-154b and/or a block (or circuit) 156. The circuits 152a-152b may each implement an input stage. The circuits 154a-154b may each implement an auto-zero stage. The circuit 156 may implement a multiplexer circuit. The half-cells 150a-150b may each implement one of the input stages 152a-152b and one of the auto-zero stages 154a-154b. The apparatus 100 may comprise other components (not shown). The number, type and/or arrangement of the components of the apparatus 100 may be varied according to the design criteria of a particular implementation.

The clock generator 110 may implement a non-overlapping clock generator. The clock generator 110 may generate signals (e.g., φCAL), signals (e.g., φSIG) and/or a signal (e.g., SEL). The signals φCAL and the signals φSIG may represent phi signals generated by the clock generator 110. The phi signals φCAL and/or φSIG may be configured to control a timing of various components of the half-cells 150a-150b. The signal SEL may be configured to control the multiplexer 156. In one example, the clock generator 110 may comprise combination logic configured to output the phi signals and/or other timing signals in response to the signal CLK. Details of the non-overlapping clock generator 110 may be described in association with FIG. 14.

The apparatus 100 may receive signals (e.g., IN_A-IN_B). The apparatus 100 may generate a signal (e.g., OUT). The signals IN_A-IN_B may be input signals. In one example, the signals IN_A-IN_B may correspond to the signals VIN and EQIN shown in association with FIG. 4. The input signals IN_A-IN_B may be received by a respective one of the half-cells 150a-150b at the input stages 152a-152b.

The input stages 152a-152b may each be configured to generate a respective signal (e.g., V_A-V_B). The signals V_A-V_B may be received by a respective one of the auto-zero stages 154a-154b. The auto-zero stages 154a-154b may each be configured to generate a respective signal (e.g., AZOUT_A-AZOUT_B). The signals AZOUT_A-AZOUT_B may each be a respective output of the half-cells 150a-150b by the respective auto-zero stages 154a-154b.

The multiplexer 156 may be configured to select between the output signals AZOUT_A-AZOUT_B. The signal selected by the multiplexer 156 may be presented as the output signal OUT. In an example, the signal OUT may correspond to the signal VOUT shown in association with FIG. 4. The apparatus 100 may generate and/or receive other signals (not shown). The number of signals generated and/or received by the apparatus 100 may be varied according to the design criteria of a particular implementation.

The auto-zero receiver 100 may comprise two amplifiers (e.g., the half-cells 150a-150b). Implementing the two amplifiers 150a-150b may enable a continuous flow of data traffic. Each half-cell (e.g., in an example, the half-cell 150a) may enter a calibration phase while the other half-cell (e.g., in an example, the half-cell 150b) is in a signal phase. The signal phases of the two amplifiers 150a-150b may briefly overlap to prevent loss of signal information while one amplifier enters the signal phase and the other amplifier exits the signal phase in order to proceed to calibration. The calibration phase may be configured to sample the voltage offset of the amplifier and store the sampled voltage offset in an input sampling capacitor. The calibration phase may be configured to persist long enough for the amplifiers 150a-150b to settle to a correct voltage level. The amount of time for settling to the correct voltage level may be a minimum length of time for calibration.

Figure 6:
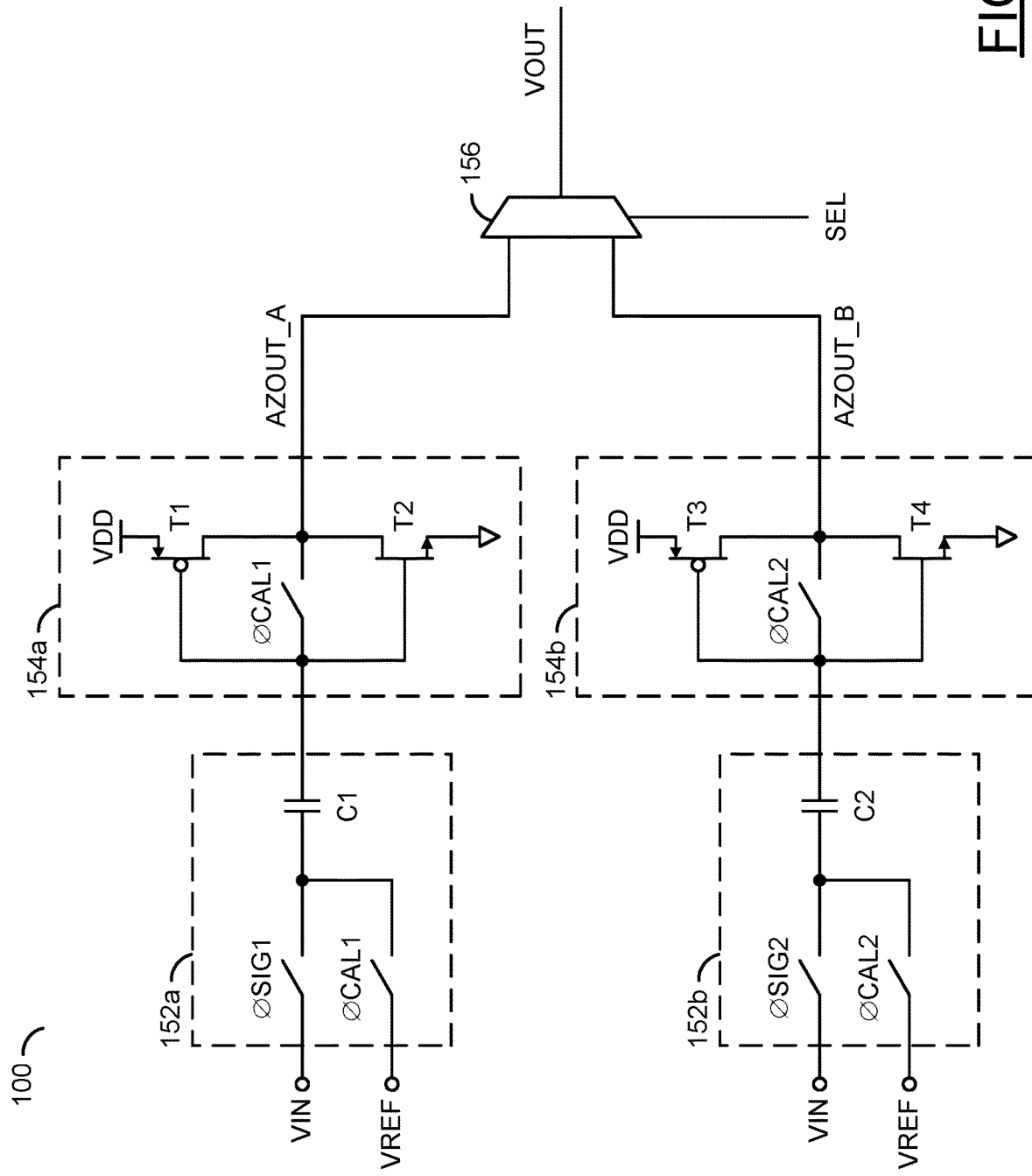
FIG. 6 is a diagram illustrating details of an example embodiment of the invention.

Referring to FIG. 6, a diagram illustrating an example embodiment of the apparatus 100 is shown. Details of the input stages 152a-152b and the auto-zero stages 154a-154b are shown. Each of the input stages 152a-152b and/or the auto zero-stages 154a-154b may comprise additional and/or alternate logic and/or components (not shown). The number, type and/or arrangement of the components of the input stages 152a-152b and/or the auto zero-stages 154a-154b may be varied according to the design criteria of a particular implementation.

The input stage 152a may comprise a switch (e.g., SIG1), a switch (e.g., CAL1) and/or a capacitance (e.g., C1). Similarly, the input stage 152b may comprise a switch (e.g., SIG2), a switch (e.g., CAL2) and/or a capacitance (e.g., C2). Each of the input stages 152a-152b may receive the signals VIN and/or a signal VREF (e.g., EQIN). The switches CALL, the switch SIG1, the switches CAL2 and/or the switch SIG2 may be controlled in response to the phi signals generated by the clock generator 110.

The input stage 152a may present the signal V_A in response to the signal VIN and/or the signal VREF. The switch SIG1 may select the signal VIN. The switch CAL1 may select the signal VREF. In an example, the switches SIG1 and CAL1 may be mutually exclusive (e.g., either SIG1 is closed and CAL1 is open or SIG1 is open and CAL1 is closed). The input stage 152a may output the signal V_A as either the signal VIN or the signal VREF.

The input stage 152b may present the signal V_B in response to the signal VIN and/or the signal VREF. The switch SIG2 may select the signal VIN. The switch CAL2 may select the signal VREF. In an example, the switches SIG2 and CAL2 may be mutually exclusive (e.g., either SIG2 is closed and CAL2 is open or SIG2 is open and CAL2 is closed). The input stage 152b may output the signal V_B as either the signal VIN or the signal VREF.

The capacitance C1 and the capacitance C2 may provide capacitive coupling between each half-cell. The capacitive coupling may enable simultaneous implementation of CTLE, DFE and/or CGA functions into a single summation node. The capacitance C1 and the capacitance C2 may be the input sampling capacitors. For example, in the calibration phase, the sampling capacitors C1 and/or C2 may be configured to store the sampled voltage offset of the amplifiers 150a-150b.

The auto-zero stage 154a may comprise a transistor (e.g., T1), a transistor (e.g., T2) and/or a switch (e.g., CAL1). The transistor T1 may be connected to VDD. The transistor T2 may be connected to ground (e.g., VSS). Similarly, the auto-zero stage 154*b* may comprise a transistor (e.g., T3), a transistor (e.g., T4) and/or a switch (e.g., CAL2). The transistor T3 may be connected to VDD. The transistor T4 may be connected to ground (e.g., VSS).

The auto-zero stage 154*a* may receive the signal V_A. When the switch CAL1 is open, the signal V_A may be presented to the gate of the transistor T1 the transistor T2 and the signal AZOUT_A may be generated based on the configuration of the transistor T1, the transistor T2 and the value of the signal V_A. When the switch CAL1 is closed, the signal V_A may be presented as the output AZOUT_A.

The auto-zero stage 154*b* may receive the signal V_B. When the switch CAL2 is open, the signal V_B may be presented to the gate of the transistor T3 the transistor T4 and the signal AZOUT_B may be generated based on the configuration of the transistor T3, the transistor T4 and the value of the signal V_B. When the switch CAL2 is closed, the signal V_B may be presented as the output AZOUT_B.

When the switches CAL1 are closed, the auto zero half-cell (e.g., 152*a* and 154*a*) may be in a calibrate phase. For example, the signal VREF may be presented as the signal AZOUT_A. When the switch SIG1 is closed, the auto zero half-cell (e.g., 152*a* and 154*a*) may be in a signal phase. For example, the signal VIN may control the transistors T1 and T2, which may enable VDD or VSS to be presented as the signal AZOUT_A. When the switches CAL2 are closed, the auto zero half-cell (e.g., 152*b* and 154*b*) may be in a calibrate phase. For example, the signal VREF may be presented as the signal AZOUT_B. When the switch SIG2 is closed, the auto zero half-cell (e.g., 152*b* and 154*b*) may be in a signal phase. For example, the signal VIN may control the transistors T3 and T4, which may enable VDD or VSS to be presented as the signal AZOUT_B.

A selection signal (e.g., SEL) may control the multiplexer 156. For example, the signal VOUT may correspond to the signal AZOUT_A or AZOUT_B based on the signal SEL.

One or more of the signals SIG1, SIG2, CAL1, CAL2 and/or SEL may be controlled in response to the non-overlapping clock generator 110. In one example, the apparatus 100 may be implemented as asynchronous to data transmission. In some embodiments, the apparatus 100 may be configured to change states in response to read/write controllers.

The embodiment of the apparatus 100 shown may provide a rail-to-rail common-mode input range. The apparatus 100 may implement a very high bandwidth and high current efficiency owing to inverter self gain. The auto zero stages 154*a*-154*b* may automatically zero mismatches (e.g., voltage mismatch). In some embodiments, an output crossing may not match the following MUX threshold. An one-stage amplifier implementation may have less than 20 dB of gain across process-voltage-temperature (PVT) variations and may not work well for VdiVW_TOTAL 80 mV spec. During a calibration phase there may be unmanaged shoot-through current.

Figure 7:
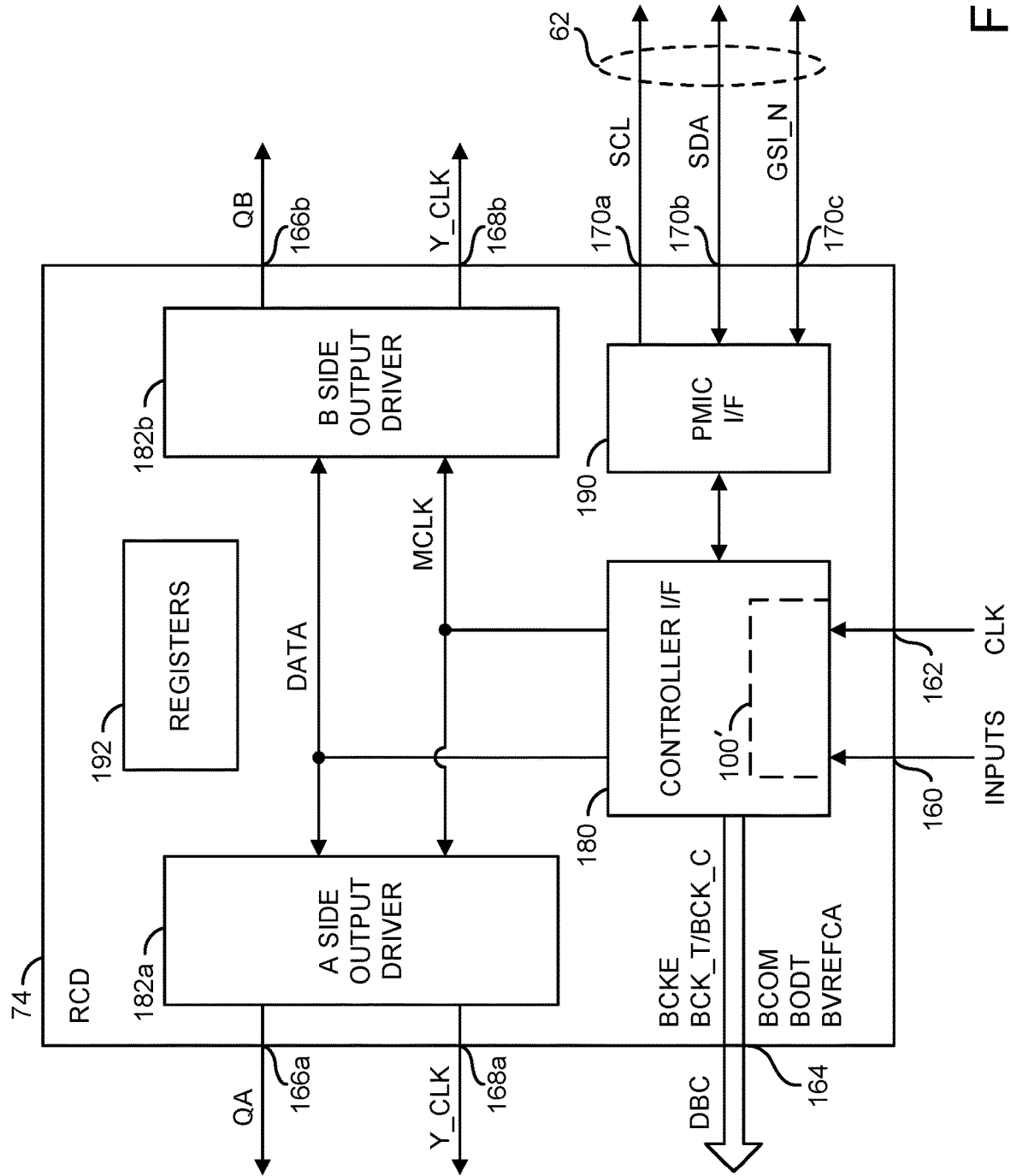
FIG. 7 is a diagram illustrating a registered clock driver in accordance with an example embodiment of the invention.

Referring to FIG. 7, a diagram is shown illustrating the registered clock driver 74 in accordance with an example embodiment of the invention. In various embodiments, the circuit 74 may implement a registered clock driver circuit (or chip). In various embodiments, the circuit 74 may be JEDEC compliant (e.g., compliant with the DDR4 specification entitled "DDR4 SDRAM", specification JESD79-4A, November 2013, published by the Joint Electron Device Engineering Council (JEDEC) Solid State Technology Association, Arlington, Va. and/or compliant with the DDR5 standard).

The circuit 74 may have an input 160 that receives input data (e.g., INPUTS), an input 162 that receives the clock signal CLK, an input/output 164 that may receive/transmit control information (e.g., DBC), outputs 166*a* and 166*b* that may provide data outputs (e.g., the Q outputs QA and QB, respectively), outputs 168*a* and 168*b* that may provide output clock signals (e.g., Y_CLK) and/or inputs/outputs 170*a*-170*c* that may send/receive data via the interface 62. The signals INPUTS and CLK may be received from a memory controller (e.g., the memory controller 20 in FIG. 1) via a memory bus of a motherboard. In an example, the signals INPUTS may be pseudo-differential using an external or internal voltage reference. The signals INPUTS may comprise the ADDR/CMD signals of FIGS. 1 and 2. In an example, the signal CLK may be implemented as differential clock signals CLK_t (true) and CLK_c (complement). The signals QA, Q3, and Y_CLK may be presented to a number of memory chips (e.g., 84*a*-84*n* in FIG. 2). For example, the signals QA, QB and Y_CLK may implement an output address and control bus for a DDR4 RDIMM, DDR4 LRDIMM, DDR4 UDIMM and/or DDR5 memory module. The signal DBC may be implemented as a data buffer control bus.

The output 170*a* may present a signal (e.g., SCL). The input/output 170*b* may communicate a signal (e.g., SDA). The input/output 170*c* may communicate a signal (e.g., GSI_N). The signal SCL may be a clock signal. The signal SDA may be a data signal. For example, the signal SDA may communicate power data. The signal GSI_N may be an interrupt signal. The signal SDA and/or the signal GSI_N may be a bi-directional signal. The signal SCL, the signal SDA and/or the signal GSI_N may each be a portion of the information communicated using the RCD-PMIC interface 62. The number of signals, the number of connections and/or the type of data communicated using the RCD-PMIC interface 62 may be varied according to the design criteria of a particular implementation.

In various embodiments the circuit 74 may comprise a block 180, blocks (or circuits) 182*a*-182*b*, a block (or circuit) 190 and/or a block (or circuit) 192. The block 180 may implement a controller interface. The blocks 182*a* and 182*b* may implement output driver circuits. In some embodiments, the blocks 182*a* and 182*b* may be combined as a single output driver circuit 182. The block 190 may implement a PMIC interface (or port) 190 in DDR5 implementations. The block 192 may implement register space. The RCD circuit 74 may comprise other components (not shown). The number, type and/or arrangement of the components implemented by the RCD 74 may be varied according to the design criteria of a particular implementation.

The block 180 may be configured to generate a data signal (e.g., DATA) and a clock signal (e.g., MCLK). The block 180 may be configured to generate the pair of signals (e.g., BCK_T/BCK_C), a signal (e.g., BCOM), a signal (e.g., BCKE), a signal (e.g., BODT) and/or a signal (e.g., BVREFCA). The signals DATA and MCLK may be presented to the blocks 182*a* and 182*b*. In various embodiments, the signal DATA may be coupled to the blocks 182*a* and 182*b* by combinatorial logic (not shown). The blocks 182*a* and 182*b* may be configured to generate the signals QA, QB and Y_CLK.

The block 190 may be configured to generate the signal SCL. The block 190 may be configured to generate and/or receive the signal SDA and/or the signal GSI_N. The block 190 may be coupled with the controller interface 180. For example, the PMIC interface 190 and/or the controller interface 180 may be configured to facilitate communication between the PMIC 76 and the memory controller 20. The PMIC interface 190 may be enabled in response to the enable command received from the host memory controller 20.

In an example, the enable command may be a VR Enable command generated by the host memory controller 20.

The block 192 may be configured to store data. For example the block 192 may comprise a number of registers used for reading from and/or writing to the RCD circuit 74. Generally, the register space 192 is coupled to the various components of the RCD using combinational logic (not shown). The block 192 may comprise a pre-defined register space to store and/or communicate power data received from and/or to be written to the PMIC 76. The pre-defined registers may store configuration data used to adjust an operating state and/or a status of the RCD 74, the interface 62 and/or the PMIC 76. In some embodiments, one or more counters may be implemented to track control words received from the host memory controller 20.

In various embodiments, the circuit 74 may be enabled to automatically adjust a skew time of a plurality of output pins during a manufacturing test operation. In various embodiments, the circuit 74 may be enabled to adjust the skew time (e.g., tSkew) to within a single gate delay of a reference output clock. As used herein, the term tSkew may be defined as the phase difference between an output data signal or pin (e.g., Q) and an output clock signal or pin (e.g., Y_CLK). In an example, a DDR4 registered clock driver (RCD) may have sixty-six output pins. In another example, a DDR5 standard registered clock driver (RCD) may have a number of pins defined by the DDR5 standard. However, other numbers of output pins may be implemented to meet the design criteria of a particular implementation.

The circuit 74 may be configured to adjust the phase of the output pins relative to the clock signal Y_CLK (or to respective copies of the clock signal Y_CLK) to meet manufacturer specifications (e.g., within +/−50 ps, etc.). The granularity of the phase adjustment is generally determined by delay elements within the circuit 74. During production testing, the circuit 74 may be configured to perform a trimming process in response to signals from automated test equipment and provide a pass/fail indication to the automated test equipment. In various embodiments, the circuit 74 may be utilized to implement the RCD in DDR4 RDIMM, DDR4 LRDIMM, DDR4 UDIMM and/or DDR5 memory modules.

The signal SCL may be a clock signal generated by the RCD 74. The signal SCL may be a clock signal that operates independently from the system clock signal (e.g., the signals BCK_T/BCK_C, the signal CLK and/or the signal MCLK)). In an example, the clock signal SCL may be an I²C clock output from the RCD 74 to the PMIC 76 communicated over the point-to-point interface 62. The signal SDA may be a data signal generated by the RCD 74 and/or received by the RCD 74. For example, the signal SDA may enable the host memory controller 20 to write to the PMIC 76 through the RCD 74 and/or read from the PMIC 76 through the RCD 74. In an example, the power data signal SDA may be an I²C data input/output between the RCD 74 and the PMIC 76 communicated over the point-to-point interface 62. The RCD 74 may use the interface 62 to send/receive the power data to/from the PMIC 76. The host memory controller 20 may perform a read operation and/or a write operation to the RCD 74 as defined by the DDR5 standard. For example, the host memory controller 20 may read the power data stored in the pre-defined registers. In another example, the host memory controller 20 may write instructions for the PMIC 76 into the pre-defined registers.

The RCD 74 may use the interface 62 to perform periodic polling and/or interrupt handling. The RCD 74 may use the interface 62 to communicate to the PMIC 76 that the memory module(s) 50a-50n are in a low powered state. The PMIC 76 may detect the notification from the interrupt signal GSI_N and respond accordingly.

In some embodiments, the RCD circuit 74 may comprise a block (or circuit) 100'. The circuit 100' may be a variation of the circuit 100. In some embodiments, the circuit 100' may be implemented wholly or partially within the circuit 180. The circuit 100' implemented within the RCD circuit 74 may be configured as the low power, auto-zeroing receiver. The circuit 100' may incorporate CTLE, VGA and/or DFE. The circuit 100' may have a similar implementation and/or functionality in the RCD 74 as the circuit 100 shown in association with the data buffers 70a-70n (e.g., as shown in association with FIG. 3).

Figure 8:
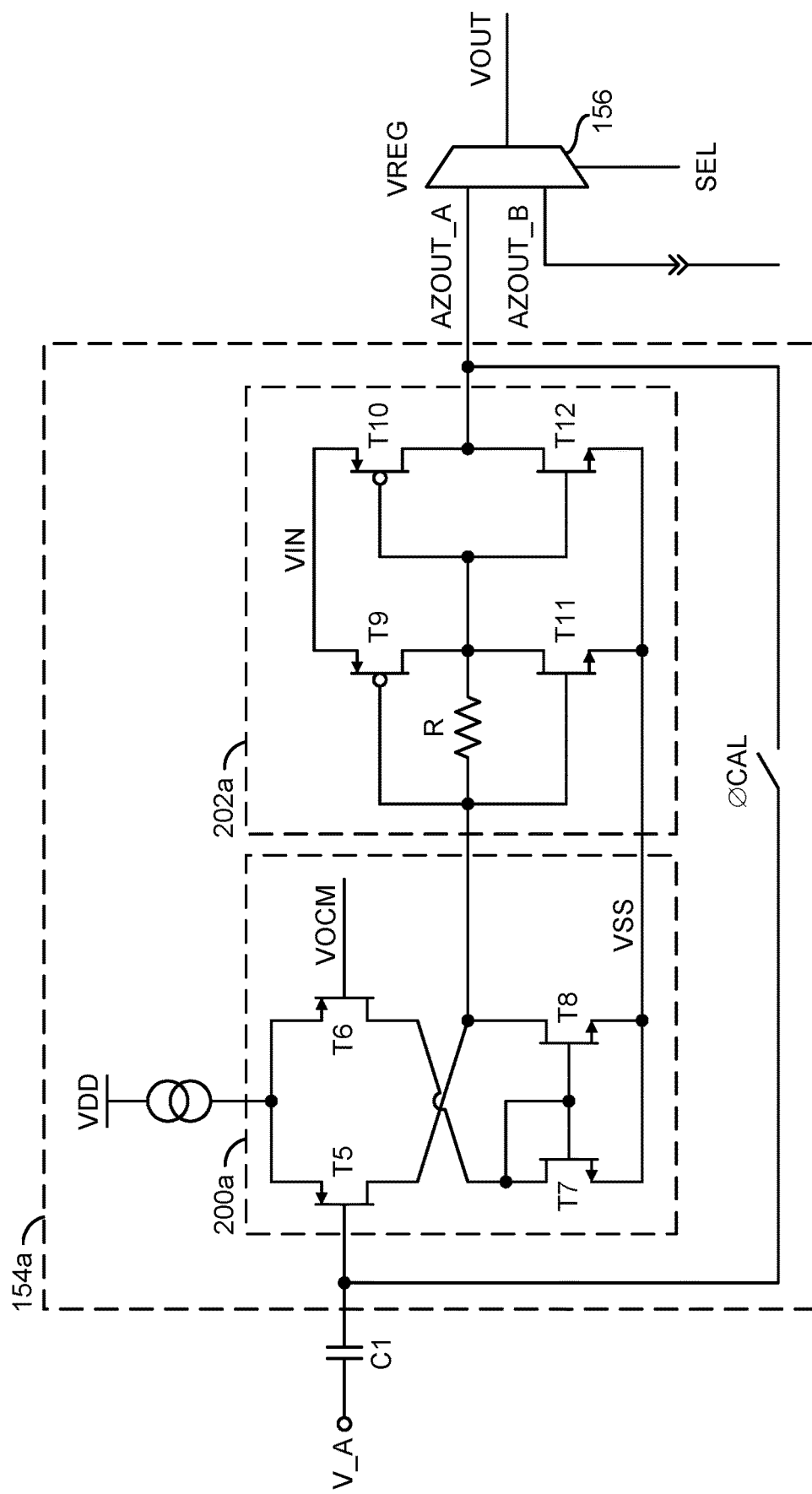
FIG. 8 is a diagram illustrating an example auto-zero stage.

Referring to FIG. 8, a diagram illustrating an example auto-zero stage 154a is shown. The auto-zero stage 154a is shown as a representative example, and the auto-zero stage 154b (not shown) may have a similar implementation. The auto-zero stage 154a may represent a better high gain cell implementation (e.g., compared to the implementation shown in association with FIG. 6).

The auto-zero stage 154a may receive the input V_A and present the output AZOUT_A. The auto-zero stage 154a may comprise a block (or circuit) 200a and a block (or circuit) 202a. The circuit 200a may implement a first stage. The circuit 202a may implement a second stage (e.g., an inverter stage). The auto-zero stage 154a may further comprise the switch CAL'. For example, the switch CAL1 may be implemented to bypass the first stage 200a and the second stage 202 (e.g., present the signal V_A as the output AZOUT_A).

The first stage 200a may comprise a transistor (e.g., T5), a transistor (e.g., T6), a transistor (e.g., T7) and a transistor (e.g., T8). The transistor T5 and the transistor T6 may be connected to VDD at a source terminal. The transistor T7 and the transistor T8 may be connected to VSS at a source terminal. A drain terminal of the transistor T5 may connect to a drain terminal of the transistor T8. A drain terminal of the transistor T6 may connect to a drain terminal of the transistor T7. The signal V_A may be presented to the gate of the transistor T5. A signal (e.g., VOCM) may be presented to the gate of the transistor T6. The gate of the transistor T7 and the transistor T8 may be connected to a drain terminal of the transistor T6. The first stage 200a may be configured to set a desired common-mode during auto-zeroing to optimize a trip point to the following mux threshold.

The second stage 202a may comprise a resistance (e.g., R), a transistor (e.g., T9), a transistor (e.g., T10), a transistor (e.g., T11) and a transistor (e.g., T12). A first end of the resistance R, a gate of the transistor T9 and a gate of the transistor T11 may each be connected to a drain of the transistor T5 and a drain of the transistor T8. A second end of the resistance R may be connected to a drain of the transistor T9, a drain of the transistor T11, a gate of the transistor T10 and a gate of the transistor T12. A source of the transistor T9 and a source of the transistor T10 may be connected to VIN. A source of the transistor T11 and a source of the transistor T12 may be connected to VSS. A drain of the transistor T10 and a drain of the transistor T12 may be connected and may be presented as the output AZOUT_A. The second stage 202a may implement additional inverter stages biased at 25 uA to increase the DC gain to approximately 36 dB before the MUX 156.

Figure 9:
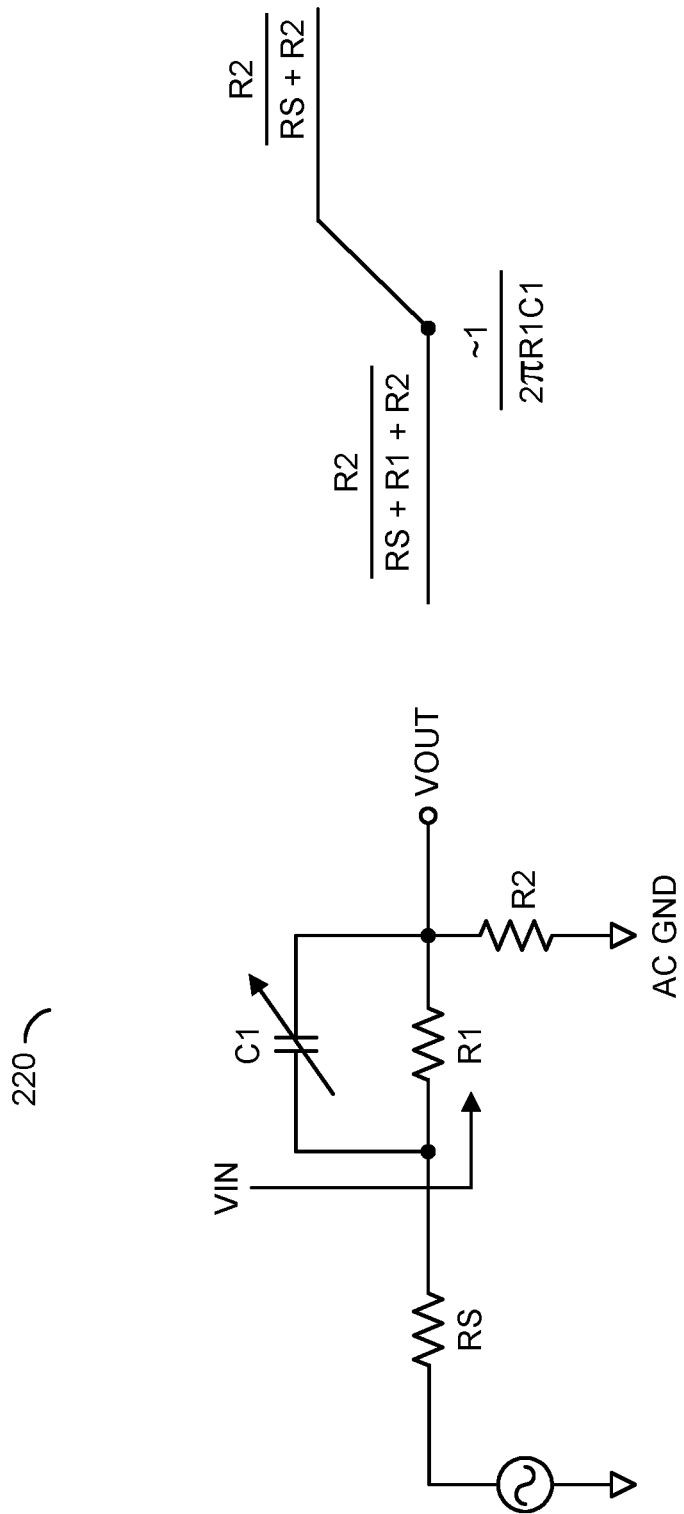
FIG. 9 is a diagram illustrating an example continuous time linear equalizer implementation using resistors.

Referring to FIG. 9, a diagram illustrating an example continuous time linear equalizer implementation 220 using resistors is shown. The circuit 220 may comprise a resistance RS, a resistance R1, a resistance R2 and/or a variable capacitance C1. The input voltage VIN may be at a node connected to the resistance RS, the resistance R1 and the variable capacitance C1. The output voltage VOUT may be at a node connected to the resistance R1, the resistance R2 and the variable capacitance C1.

In one example, the apparatus 100 may implement passive CTLE. The CTLE implementation 220 may be applied integral to the termination. The CTLE implementation 220 may impact the driver and/or add significant Cio.

Figure 10:
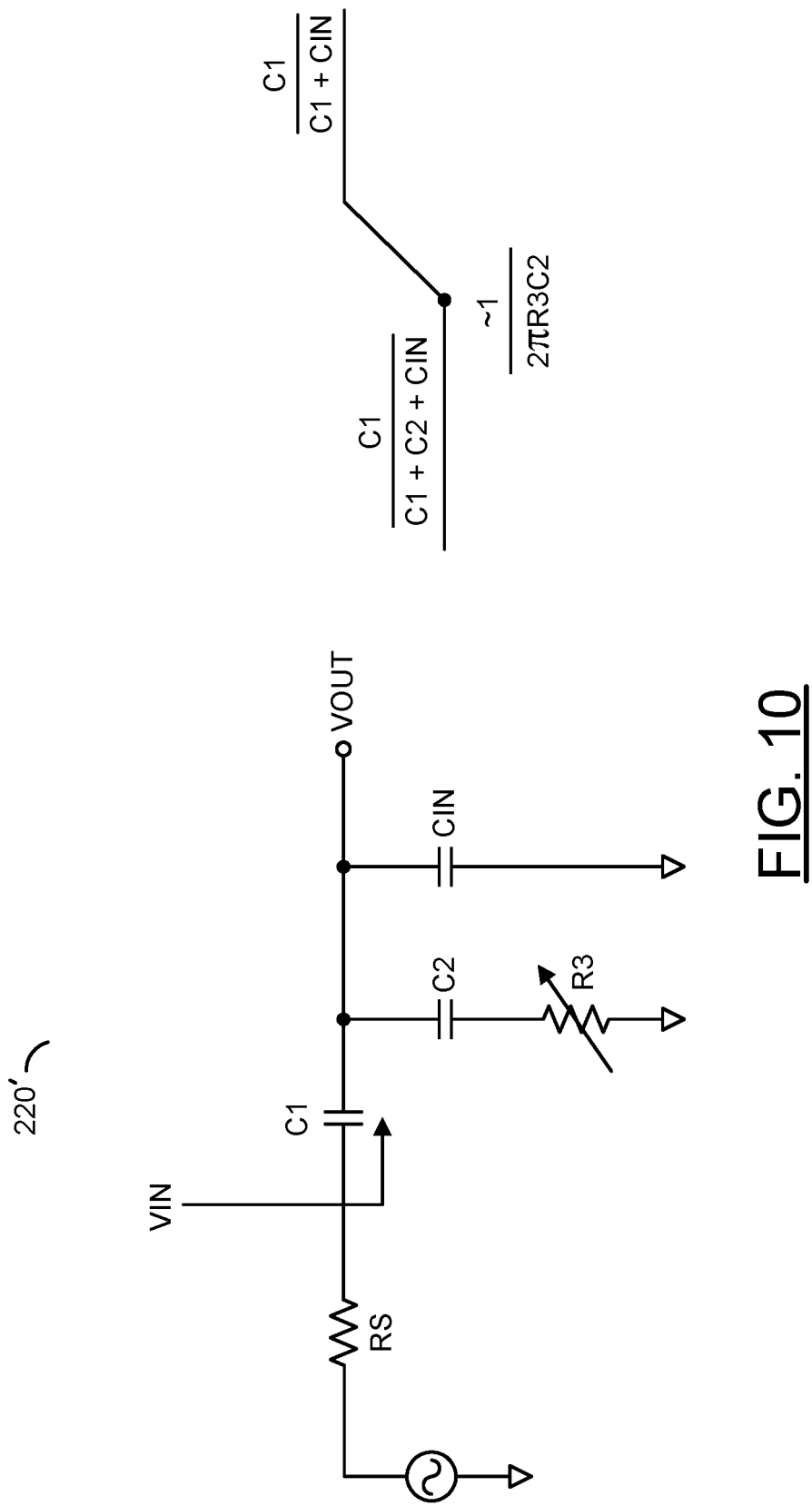
FIG. 10 is a diagram illustrating an example continuous time linear equalizer implementation using capacitors.

Referring to FIG. 10, a diagram illustrating an example continuous time linear equalizer implementation 220' using capacitors is shown. The circuit 220' may comprise a resistance RS, a variable resistance R3, a capacitance C1, a capacitance C2 and a capacitance CIN. The input voltage VIN may be at a node connected to the resistance RS and the capacitance C1. The output voltage VOUT may be at a node connected to the capacitance C1, the capacitance CIN and the capacitance C2. The variable resistance may be connected between one end of the capacitance C2 and AC ground.

In one example, the apparatus 100 may implement the passive CTLE of the CTLE implementation 220' in order to mitigate Cio and/or an impact to the transmission. The CTLE implementation 220' may be implemented with a capacitance divider. The low-frequency cutoff may not be an issue because of the periodic auto-zeroing implemented by the topology of the apparatus 100.

Figure 11:
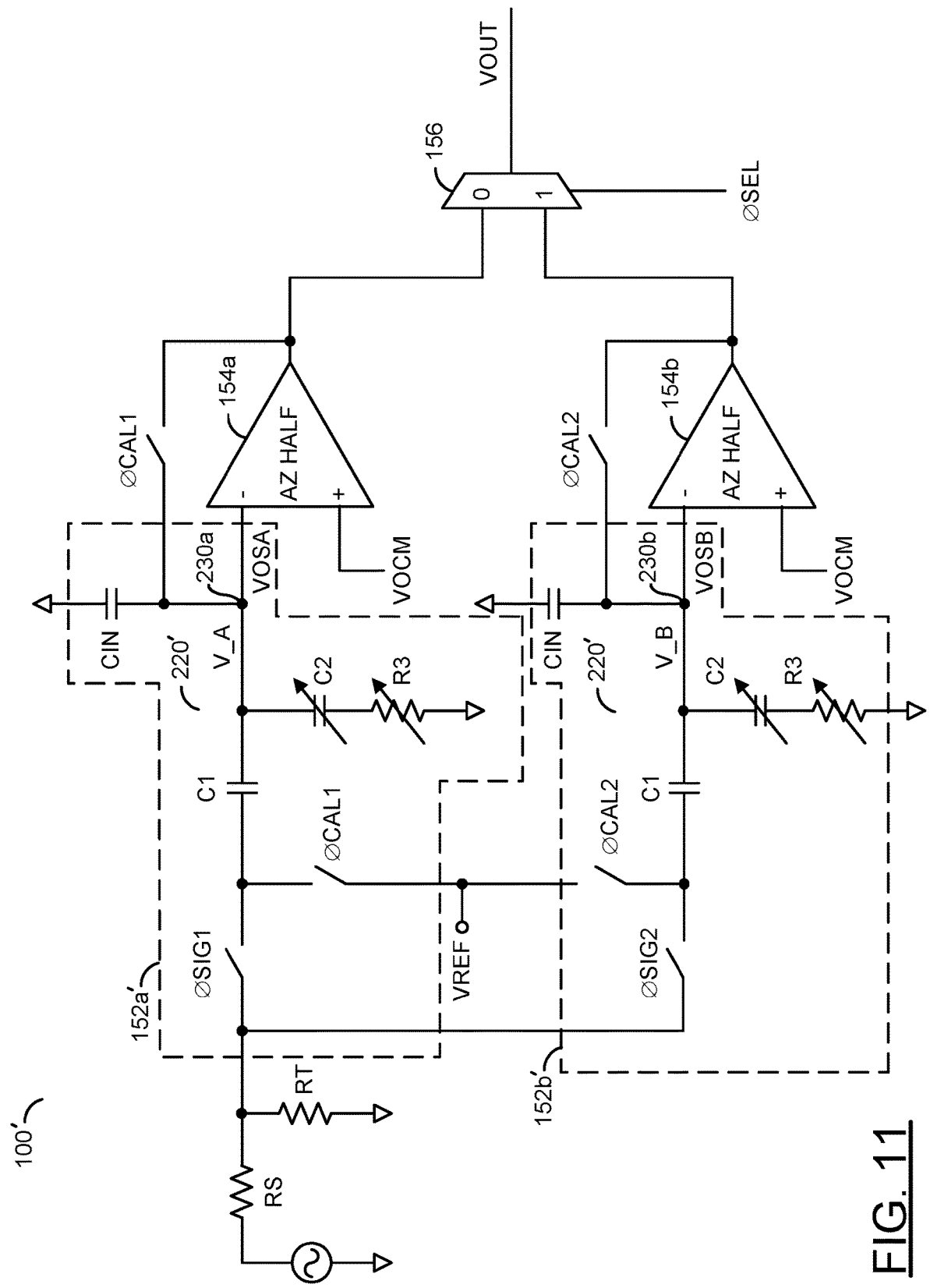
FIG. 11 is a diagram illustrating an example embodiment of the apparatus with an input stage implementing CTLE.

Referring to FIG. 11, a diagram illustrating an example embodiment of the apparatus 100' with the input stages 152a'-152b' implementing the CTLE 220' is shown. The signal VIN and the signal VREF may be configured to be presented to each of the half-cells 150a-150b. The capacitance-divider CTLE implementation 220' is shown within the each of the input stages 152a'-152b'. In an example, the apparatus 100' may implement an auto-zero (ping-pong) receiver with optional integrated passive CTLE.

In the example shown, the capacitance C1 of the CTLE implementation 220' may be at a node comprising the switch SIG1 and the switch CAL1 in the input stage 152a'. Similarly, the capacitance C1 of the CTLE implementation 220' may be at a node comprising the switch SIG2 and the switch CRL2 in the input stage 152b'. The output VOUT of the CTLE implementation 220' may correspond with the signal V_A in the input stage 152a'. For example, in the half-cell 150a, the signal V_A may be at a node 230a comprising the capacitance C1, the variable capacitance C2, and the capacitance CIN. Similarly, the output VOUT of the CTLE implementation 220' may correspond with the signal V_B in the input stage 152b'. For example, in the half-cell 150b, the signal V_B may be at a node 230b comprising the capacitance C1, the variable capacitance C2, and the capacitance CIN.

In the half-cell 150a, the signal V_A may be received at the node 230a comprising a negative terminal of the auto-zero stage 154a and the switch CALL. A voltage (e.g., VOSA) may be present between the node 230a and the negative terminal of the auto-zero stage 154a. In the half-cell 150b, the signal V_B may be received at the node 230b comprising a negative terminal of the auto-zero stage 154b and the switch CAL2. A voltage (e.g., VOSB) may be present between the node 230b and the negative terminal of the auto-zero stage 154b. A positive terminal of both of the auto-zero stages 154a-154b may receive the signal VOCM. The signal VOCM may be a common-mode reference that determines the output voltage of the input stages 152a'-152b' for when the input voltage VIN is equal to the reference voltage VREF during the active phase.

The auto-zero stages 154a-154b may be implemented as amplifiers. The auto-zero stages 154a-154b may present the signals AZOUT_A-AZOUT_B to the multiplexer 156. When the switch CAL1 is closed, the auto-zero stage 154a may receive negative feedback. When the switch CAL2 is closed, the auto-zero stage 154b may receive negative feedback. The multiplexer 156 may select between the signals AZOUT_A-AZOUT_B based on the selection signal SEL.

The signal VOSA and the signal VOSB may each be an offset voltage. The offset voltages VOSA-VOSB may be inherent to the amplifiers 154a-154b, respectively. In one example, the offset voltage VOSA may be modeled as a series voltage source between V_A at the node 230a and the negative terminal of the amplifier 154a. In another example, the offset voltage VOSB may be modeled as a series voltage source between V_B at the node 230b and the negative terminal of amplifier 154b. The offset voltages VOSA-VOSB may be present in both amplification (e.g., signal) and calibration phases. The voltage offset voltages VOSA-VOSB may be sampled and held on the capacitance C1 for V_A and V_B in the circuits 152a'-152b', respectively.

Figure 12:
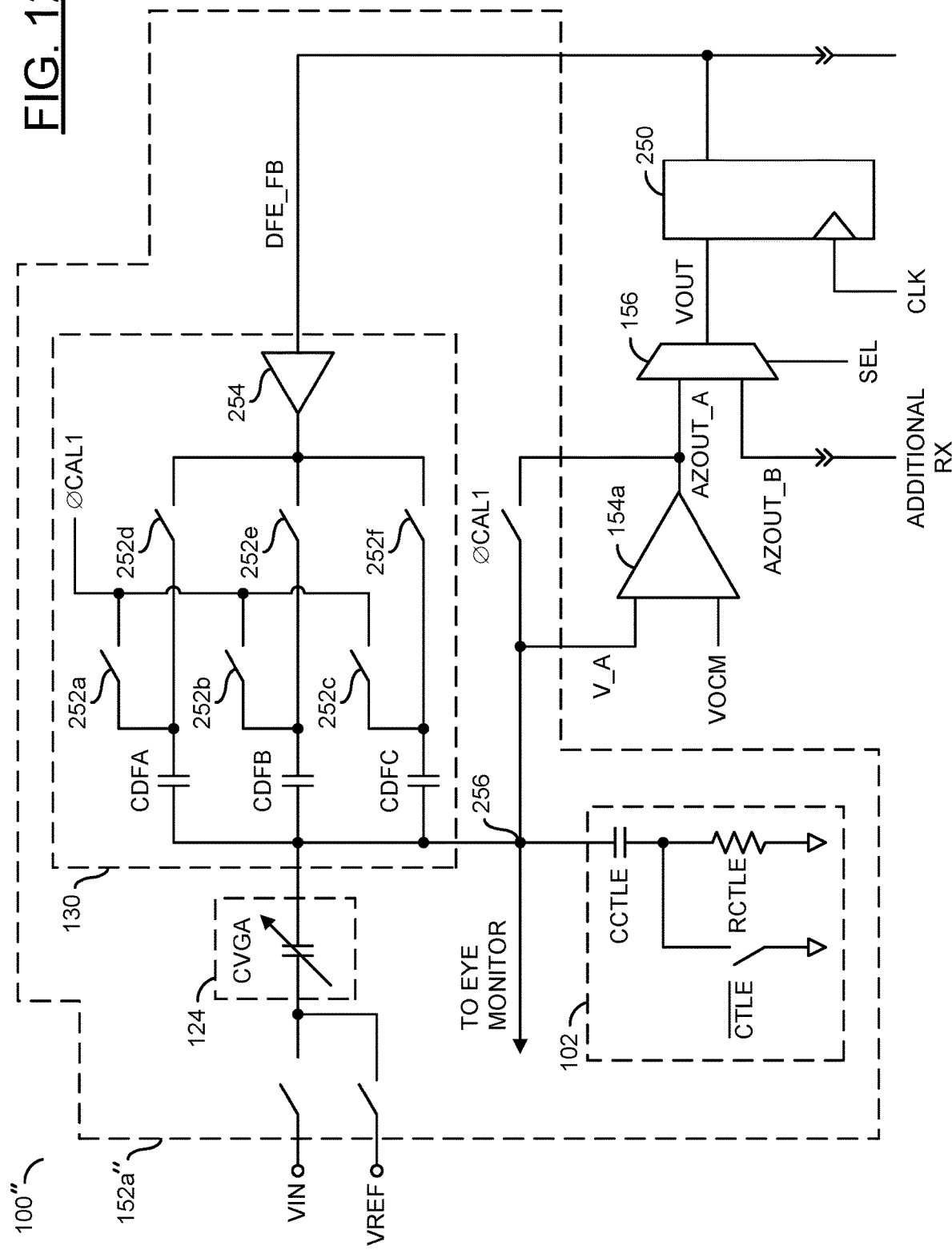
FIG. 12 is a diagram illustrating an example embodiment of the apparatus with an input stage implementing CTLE, a decision feedback equalizer, and a variable gain amplifier.

Referring to FIG. 12, a diagram illustrating an example embodiment of the apparatus 100" with the input stage 152a" implementing CTLE, a decision feedback equalizer, and a variable gain amplifier is shown. The input stage 152a" may comprise the CTLE module 102, the BIAS_VGA module 124 and/or the DFE iDAC module 130 shown in association with FIG. 4. The apparatus 100" may be configured to implement CTLE, DFE, VGA and/or eye-monitoring. The apparatus 100" may be extended to comprise the functionality of one or more of the modules 122-140 shown in association with FIG. 4.

The input stage 152a" is shown connected to the auto-zero stage 154a, the multiplexer 156 and/or a block (or circuit) 250. The circuit 250 may implement a flip-flop. In the example shown, one of the half-cells 150a-150b are shown (e.g., the circuit 152a" and the circuit 154a). However, the multiplexer 156 may also receive input from the other half cell (e.g., the half-cell 150b, not shown). For example, the other input stage 152b" (not shown) may also implement the CTLE module 102, the BIAS_VGA module 124 and/or the DFE iDAC module 130.

The input stage 152a" may receive the input VIN, the input VREF and/or an input signal (e.g., DFE_FB). The signal DFE_FB may be a feedback signal presented by the flip-flop 250. For example, the signal DFE_FB may be presented to both of the input stages 152a"-152b". One of the input signals VIN or VREF may be presented to the VGA module 124. For example, the switches SIG1 or CAL1 (as described in association with FIG. 6) may control which of the signals VIN or VREF is presented to the VGA module 124. The VGA module 124 may comprise a variable capacitance (e.g., CVGA). The output of the VGA module 124 may be presented to a summation node 256.

The DFE iDAC module 130 may receive the signal DFE_FB and be connected to the summation node 256. The DFE iDAC module 130 may comprise a capacitance CDFA, a capacitance CDFB, a capacitance CDFC, a network of switches 252a-252f and/or a buffer 254. The buffer 254 may receive the signal DFE_FB. An output of the buffer 254 may be presented to the switches 252d-252f. The switches 252a-252c may be connected to the signal CAL1. One end of the capacitance CDFA, the capacitance CDFB and the capacitance CDFC may each be connected to the summation node 256. Another end of the capacitance CDFA may be connected to the switch 252a and the switch 252d. Another end of the capacitance CDFB may be connected to the switch 252b and the switch 252e. Another end of the capacitance CDFC may be connected to the switch 252c and the switch 252f. The summation node 256 that is connected to the capacitance CDFA, the capacitance CDFB and the capacitance CDFC may receive an output of the DFE iDAC module 130.

The CTLE module 102 may be connected to the summation node 256. The CTLE module 102 may comprise a switch CTLE, a resistance RCTLE and/or the capacitance CCTLE. In the example shown, the switch CTLE and the resistance RCTLE may be connected to AC ground. One end of the capacitance CCTLE may connect to the resistance RCTLE and the switch CTLE. Another end of the capacitance CCTLE may connect to the summation node 256. In some embodiments, the CTLE module 102 may comprise the CTLE implementation 220'.

The summation node 256 may connect to the DFE iDAC module 130, the CTLE module 102, the VGA module 124 an input to the auto-zero stage 154a and/or the switch CAL1. The summation node 256 may comprise capacitive coupling of the variable capacitance CGVA of the VGA module 124, the capacitances CDFA-CDFC of the DFE iDAC module 130 and/or the capacitance CCTLE of the CTLE module 102. The capacitive coupling may be configured to simultaneously incorporate the CTLE, DFE and/or VGA functions into the single summation node 256. The voltage at the summation node 256 may be sampled by the eye monitor (e.g., the eye monitor (EM) buffer module 132 and the EM slicer module 140 shown in association with FIG. 4). When the switch CAL1 is open, the voltage at the summation node 256 may be the signal V_A presented to the input of the auto-zero stage 154a. When the switch CAL1 is closed, the auto-zero stage 154a may provide negative feedback from the output of the auto-zero stage 154a to the summation node 256.

The auto-zero stage 154a may receive the output V_A from the input stage 152a" and the signal VOCM. The auto-zero stage 154a may present the signal AZOUT_A. The multiplexer 156 may receive the signal AZOUT_A from the half-cell 150a and the signal AZOUT_B from the half-cell 150b. The multiplexer 156 may present one of the signals AZOUT_A-AZOUT_B as the signal VOUT in response to the selection signal SEL.

The flip-flop 250 may sample the signal VOUT based on a clock signal CLK. The flip-flop 250 may generate the feedback signal DFE_FB in response to the signal VOUT and the signal CLK. The flip-flop 250 may present the signal DFE_FB to each of the input stages 152a"-152b". In an example, the flip-flop 250 may be the DEFF module 138 shown in association with FIG. 4.

Figure 13:
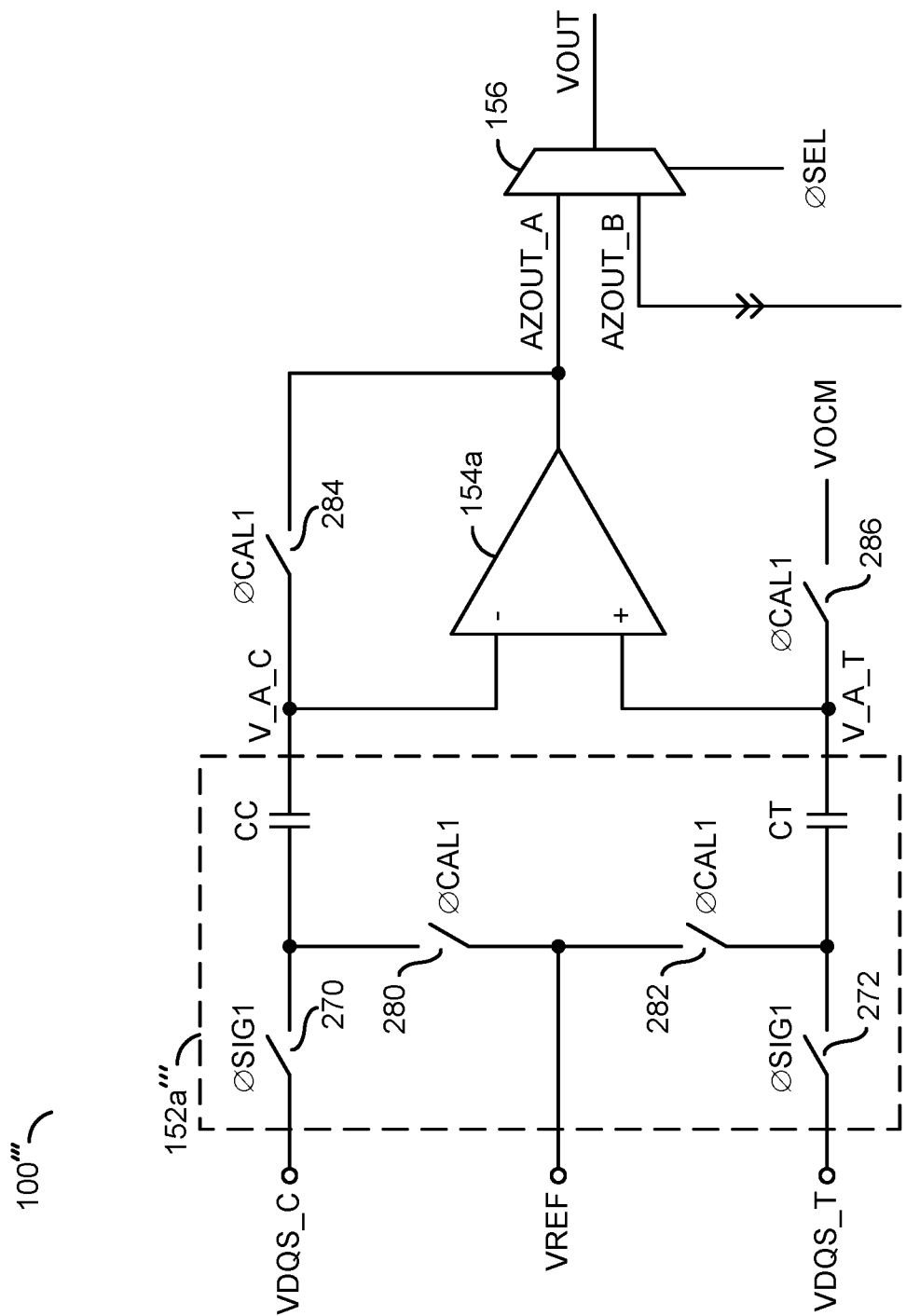
FIG. 13 is a diagram illustrating an example embodiment of the apparatus with an input stage configured to receive differential input signals.

Referring to FIG. 13, a diagram illustrating an example embodiment of the apparatus 100'" with the input stage 152a'" configured to receive differential input signals is shown. The apparatus 100'" may be implemented for differential input/output (e.g., the signals DQS and/or the signals MDQS shown in association with FIG. 3). For example, clock receivers may have differential inputs. To accommodate differential inputs, the apparatus 100'" may be configured to couple in both inputs and additional switches may be implemented. In one example, opposite edge polarity may be achieved by generating inverse polarity at the output. In another example, opposite edge polarity may be achieved by building an identical complementary receiver. Since the input is differential, the apparatus 100'" may provide common-mode rejection within the active region of the amplifier 154a.

The apparatus 100'" may comprise the half-cells 150a-150b (e.g., in the example, only the portion of the apparatus 100'" comprising the half-cell 150a is shown). The half-cell 150a may comprise the input stage 152a'" and the auto-zero stage 154a. The half-cell 150a may receive a signal (e.g., VDQS_C), the signal VREF and a signal (e.g., VDQS_T). The signals VDQS_C and VDQS_T may be differential input signals (e.g., a differential version of the signal VIN). The half-cell 150a may present the signal AZOUT_A to the multiplexer 156.

The input stage 152a'" may receive the differential signals VDQS_C and VDQS_T and the signal VREF. The input stage 152a'" may generate a signal (e.g., V_A_C) and a signal (e.g., V_A_T). The signals V_A_C and V_A_T may be a differential output. In an example, the signal V_A_C may correspond to the signal EQOP and the signal V_A_T may correspond to the signal EQON shown in association with FIG. 4.

The input stage 152a'" may comprise a switch 270, a switch 272, a switch 280, a switch 282, a capacitance CC and/or a capacitance CT. The switches 270-272 may be controlled by SIG1.

The switches 280-282 may be controlled by CALL. For example, either the switches 270-272 may be closed and the switches 280-282 may be open, or the switches 270-272 may be open and the switches 280-282 may be closed. When the switches 270-272 are closed, the capacitance CC may receive the input signal VDQS_C and the capacitance CT may receive the input signal VDQS_T. When the switches 280-282 are closed, the capacitance CC may receive the signal VREF and the capacitance CT may receive the signal VREF. An output of the input stage 152a'" may present the signal V_A_C from the capacitance CC. An output of the input stage 152a'" may present the signal V_A_T from the capacitance CT.

The auto-zero stage 154a is shown as an amplifier. The signal V_A_C may be presented to a negative terminal of the auto-zero stage 154a. The signal V_A_T may be presented to a positive terminal of the auto-zero stage 154a. The auto-zero stage 152a may present the signal AZOUT_A. A switch 284 is shown between the output and the negative terminal of the auto-zero stage 154a. For example, when the switch 284 is closed, the auto-zero stage 154a may receive negative feedback from the signal AZOUT_A. A switch 286 is shown between the signal VOCM and the positive terminal of the auto-zero stage 154a. The switches 284-286 may be controlled by CALL.

The auto-zero stage 154a may present the signal AZOUT_A to one input of the multiplexer 156. The multiplexer 156 may receive the signal AZOUT_B from the other half-cell 150b. The multiplexer 156 may present the signal VOUT in response to the signals AZOUT_A-AZOUT_V and the selection signal SEL. In an example, the auto-zero stage 154a and the multiplexer 156 may be components of the D2S module 104 shown in association with FIG. 4.

Figure 14:
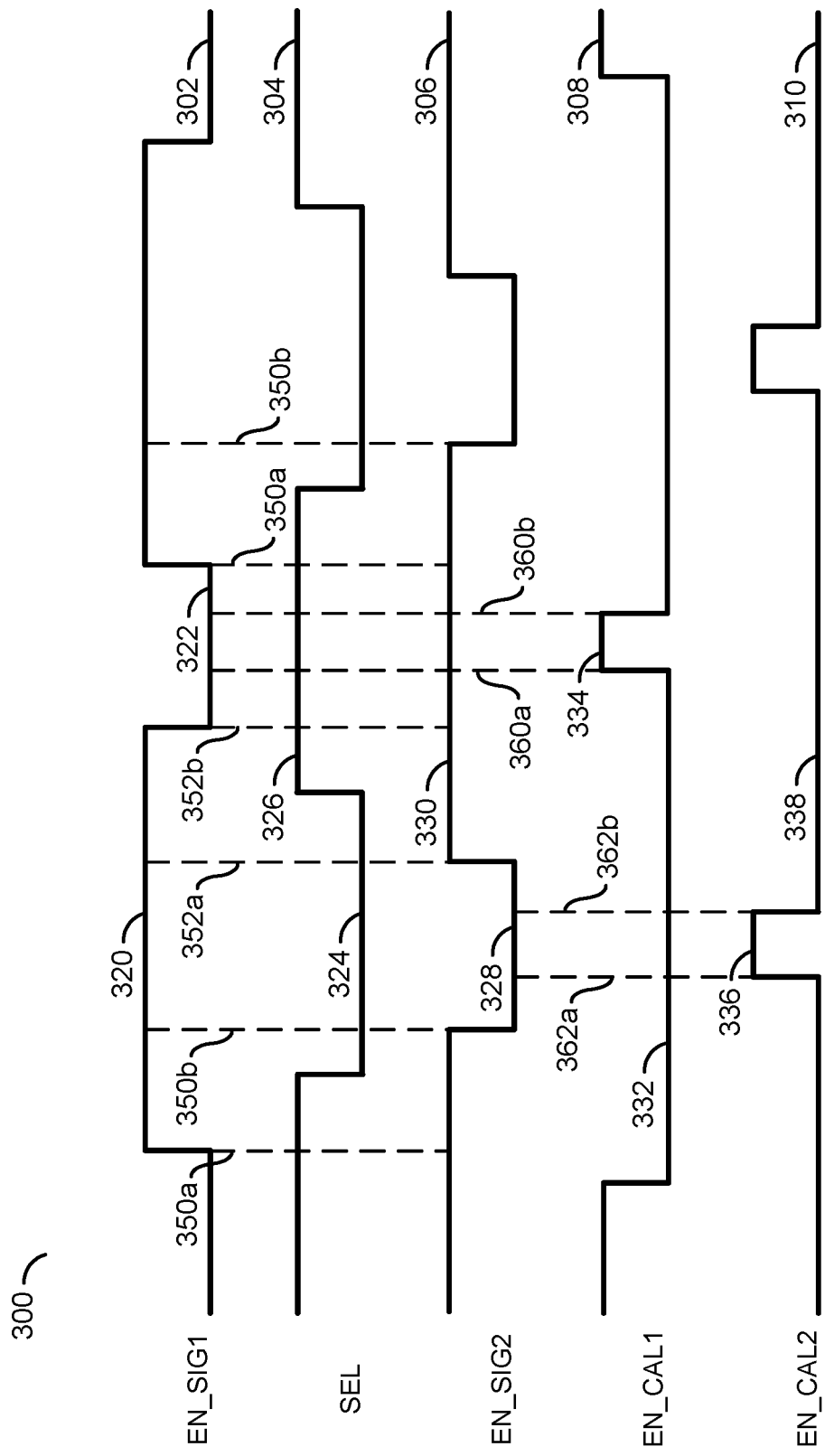
FIG. 14 is a timing diagram illustrating an example non-overlapping clock signal relationship.

Referring to FIG. 14, a timing diagram 300 illustrating an example non-overlapping clock signal relationship is shown. The timing diagram 300 may comprise a waveform 302, a waveform 304, a waveform 306, a waveform 308 and/or a waveform 310. The waveform 302 may correspond to a signal (e.g., EN_SIG1). The signal EN_SIG1 may be configured to control phi switches corresponding to SIG1. The waveform 304 may correspond to the signal SEL (e.g., for selecting the output of the multiplexer 156). The waveform 306 may correspond to a signal (e.g., EN_SIG2). The signal EN_SIG2 may be configured to control phi switches corresponding to SIG2. The waveform 308 may correspond to a signal (e.g., EN_CAL1). The signal EN_CAL1 may be configured to control phi switches corresponding to CAL1. The waveform 310 may correspond to a signal (e.g., EN_CAL2). The signal EN_CAL2 may be configured to control phi switches corresponding to CAL2. The timing diagram 300 may show example phase relationships for implementing the apparatus 100.

The waveforms 302-310 may be generated by the clock-generator 110 (shown in association with FIG. 3 and/or FIG. 5).

The clock-generator 110 may be a non-overlapping clock generator. In an example, the clock-generator 110 may have a maximum input speed of 125 MHz (e.g., 8 ns CLK). In another example, the clock-generator 110 may have a typical input of 100 MHz (e.g., 10 ns CLK). The non-overlapping clock-generator 110 may create delays using combination logic to ensure non-overlapping clocks. The non-overlapping clock-generator 110 may provide a divided core clock. In one example, the clock-generator 110 may be implemented in the apparatus 100. In another example, the clock-generator 110 may be implemented by each of the data-buffers 70a-70n. In yet another example, the clock-generator 110 may be implemented by the RCD 74. The implementation of the clock-generator 110 may be varied according to the design criteria of a particular implementation.

The waveform 302 is shown having an "ON" portion 320 and an "OFF" portion 322. The "ON" portion 320 may correspond to a signal (e.g., active) phase of the half-cell 150a. The "OFF" portion 322 may correspond to an amount of time that the half-cell 150a has exited the signal phase. In the example shown, one of the portions 320-322 are shown. However, the portions 320-322 may repeat (e.g., periodically).

The waveform 304 is shown having a logical low portion 324 and a logical high portion 326. The logical low portion 324 may correspond to a time within the "ON" portion 320. For example, the logical low portion 324 may enable the multiplexer 156 to select the output of the half-cell 150a.

The waveform 306 is shown having an "OFF" portion 328 and an "ON" portion 330. The "OFF" portion 328 may correspond to an amount of time that the half-cell 150b has exited the signal phase (e.g., active phase). The "ON" portion 330 may correspond to the signal phase of the half-cell 150b. In the example shown, one of the portions 328-330 are shown. However, the portions 328-330 may repeat (e.g., periodically).

The logical high portion 326 of the waveform 304 may correspond to a time within the "ON" portion 330 of the waveform 306 (and the "OFF" portion 322 of the waveform 302). For example, the logical high portion 326 may enable the multiplexer 156 to select the output of the half-cell 150b.

The waveform 308 is shown having an "OFF" portion 332 and an "ON" portion 334. The "OFF" portion 332 may correspond to an amount of time that the half-cell 150a has exited the calibration phase. The "ON" portion 334 may correspond to the calibration phase of the half-cell 150a. In the example shown, one of the portions 332-334 are shown. However, the portions 332-334 may repeat (e.g., periodically).

The waveform 310 is shown having an "ON" portion 336 and an "OFF" portion 338. The "ON" portion 336 may correspond to the calibration phase of the half-cell 150b. The "OFF" portion 338 may correspond to an amount of time that the half-cell 150b has exited the calibration phase. In the example shown, one of the portions 336-338 are shown. However, the portions 336-338 may repeat (e.g., periodically).

The various signals of the present invention are generally "ON" (e.g., a digital HIGH, or logical 1) or "OFF" (e.g., a digital LOW, or logical 0). However, the particular polarities of the "ON" (e.g., asserted) and "OFF" (e.g., de-asserted) states of the signals may be adjusted (e.g., reversed) accordingly to meet the design criteria of a particular implementation.

Dotted lines 350a-350b may correspond to an amount of time that the waveform 302 begins the "ON" portion 320 and the waveform 306 exits the "ON" portion 330. Similarly, the dotted lines 352a-352b may correspond to an amount of time that the waveform 302 exits the "ON" portion 320 and the waveform 306 begins the "ON" portion 330. Generally for some amount of time, the "ON" portion 320 of the waveform 302 and the "ON" portion 330 of the waveform 306 may overlap. Overlapping the "ON" portion 320 and the "ON" portion 330 may enable a continuous flow of data. In one example, the waveform 304 may transition from the logical high portion 326 to the logical low portion 324 (e.g., changing the selection for VOUT for the multiplexer 156 from the signal AZOUT_B to the signal AZOUT_A) during the overlapping region 350a-350b. In one example, the waveform 304 may transition from the logical low portion 324 to the logical high portion 326 (e.g., changing the selection for VOUT for the multiplexer 156 from the signal AZOUT_A to the signal AZOUT_B) during the overlapping region 352a-352b.

Dotted lines 360a-360b may show a correlation between the "ON" portion 334 of the waveform 308 to the waveform 302. The dotted lines 360a-360b show that the "ON" portion 334 of the waveform 308 corresponds to the "OFF" portion 322 of the waveform 302. For example, the half-cell 150a may enter the calibration phase only when the input voltage VIN is not selected (e.g., the signal VREF is selected). The clock-generator 110 may be configured to ensure that the "ON" portion 334 does not overlap the "ON" portion 320 of the waveform 302.

Dotted lines 362a-362b may show a correlation between the "ON" portion 336 of the waveform 310 to the waveform 306. The dotted lines 362a-362b show that the "ON" portion 336 of the waveform 310 corresponds to the "OFF" portion 328 of the waveform 306. For example, the half-cell 150b may enter the calibration phase only when the input voltage VIN is not selected (e.g., the signal VREF is selected). The clock-generator 110 may be configured to ensure that the "ON" portion 336 does not overlap the "ON" portion 330 of the waveform 306.

The apparatus 100 may be configured to control idle-to-active timing and/or limit power consumption (e.g., optimize power consumption) by holding one of the half-amplifiers (e.g., the auto-zero stage 154b) in power-down while the other half-amplifier (e.g., the auto-zero stage 154a) is held in the calibration phase. When idle-to-active occurs, the amplifier that has been calibrating (e.g., the auto-zero stage 154a) may immediately transition to the active (e.g., signal phase). Transitioning to the signal phase may comprise a logical delay to change the phi switch phases (e.g., the waveforms 302-310). The half-amplifier that has been in power-down (e.g., the auto-zero stage 154b) may be powered-up and enters calibration.

Embodiments of the apparatus 100 may be detected by visual (e.g., microscope) inspection of the circuitry to observe dual inputs per pin. Additionally, a lack of trim for mismatch while achieving very accurate input sensitivity may be an indicator of the apparatus 100.

In some embodiments, VREF may be at the center of the input eye. A voltage VICM may be equal to VOCM added to an offset voltage (e.g., VOSA-VOSB). A different between VREF and VICM may be equal to a capacitance voltage (e.g., the capacitor C1). In an example, a capacitive coupled signal may swing around VICM. The apparatus 100 may be configured to inherently zero out voltage mismatch (e.g., systematic and random).

In some embodiments, there may be a momentary overlap between active cycles to ensure glitch-free switching. The receiver 100 may switch between active and auto-zero calibration cycles. By switching between active and auto-zero calibration, mismatch and process sensitivities may be removed.

Non-overlapping clock generation may be implemented for the apparatus 100. In one example, the clock generation may be implemented in analog and digital may provide a divided core clock.

In another example, a digital implementation may build the non-overlapping clocks directly and provide to the analog. The clock generator 110 may create delay. The clock generator 110 may use combination logic to ensure non-overlapping clocks. For example, the two identical half-cells 150a-150b may be instantiated with the clock generator 110.

An inverter replica (e.g., 25 uA) may control the output bias current of the apparatus 100. Alternatively, inverters may be connected to VREG at some power/performance penalty. In one example, the signal VOCM may be set to half of VREG if desired but an inverter replica may be used (−10 uA). Front-end bias may be implemented as a simple cascode cell with a capacitance to mitigate idle-active transitions.

The signal VREF may be set to any valid (e.g., according to the DDR4 and/or DDR5 specification) voltage so long as the 1.2V switch body terminals do not forward-bias. For the passive CTLE implementation 220', a Cio adder may be equivalent to approximately 70 fF set by passive CTLE inside of the switches. In one example, typical values may be 25 C/1.2V/0.9V. In one example, using the CTLE implementation 220' approximately 4 dB of CTLE may be achieved.

Although embodiments of the invention have been described in the context of a DDR4 application, the present invention is not limited to DDR4 applications, but may also be applied in other high data rate digital communication applications where different transmission line effects, cross-coupling effects, traveling wave distortions, phase changes, impedance mismatches and/or line imbalances may exist. The present invention addresses concerns related to high speed communications, flexible clocking structures, specified command sets and lossy transmission lines. Future generations of DDR can be expected to provide increasing speed, more flexibility, additional commands and different propagation characteristics. The present invention may also be applicable to memory systems implemented in compliance with either existing (legacy) memory specifications or future memory specifications.

The functions performed by the diagrams of FIGS. 1-14 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (erasable programmable ROMs), EEPROMs (electrically erasable programmable ROMs), UVPROMs (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, cloud servers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
a first half-cell comprising a first input stage and a first auto-zero stage, wherein said first input stage is configured to present a first input signal to said first auto-zero stage;
a second half-cell comprising a second input stage and a second auto-zero stage, wherein said second input stage is configured to present a second input signal to said second auto-zero stage; and
a multiplexer configured to (a) receive a first output from said first auto-zero stage, (b) receive a second output from said second auto-zero stage and (c) present one of said first output and said second output, wherein (i) said first half-cell and said second half-cell implement a capacitive coupling, (ii) said capacitive coupling provides a rail-to-rail common-mode input range, (iii) said first half-cell and said second half-cell are configured to prevent a mismatch between data signals and clock signals and (iv) said first half-cell and said second half-cell are each configured to implement a calibration when idle.

2. The apparatus according to claim 1, wherein said mismatch is prevented such that trim is not needed.

3. The apparatus according to claim 1, wherein said first input stage and said second input stage are configured to implement a continuous time linear equalizer.

4. The apparatus according to claim 3, wherein said first input stage and said second input stage are further configured to implement a variable gain amplifier.

5. The apparatus according to claim 4, wherein said first input stage and said second input stage are further configured to implement a decision feedback equalizer.

6. The apparatus according to claim 3, wherein said continuous time linear equalizer is implemented using a capacitor divider.

7. The apparatus according to claim 1, wherein said apparatus is implemented as part of a receiver for a memory interface.

8. The apparatus according to claim 1, wherein said mismatch between said data signals and said clock signals is approximately 1 mV.

9. The apparatus according to claim 1, wherein said first auto-zero stage and said second auto-zero stage each comprise a first stage configured to perform an auto-zeroing and an inverter stage.

10. The apparatus according to claim 9, wherein said inverter stage is biased at 25 μA to increase a DC gain to approximately 36 dB.

11. The apparatus according to claim 1, wherein (i) said capacitive coupling is implemented at a summation node and (ii) said capacitive coupling at said summation node enables said apparatus to simultaneously implement functions of a continuous time linear equalizer, a variable gain amplifier, a decision feedback equalizer, and eye monitoring.

12. The apparatus according to claim 1, wherein said first input signal and said second input signal comprise said data signals.

13. The apparatus according to claim 1, wherein said first input signal and said second input signal each comprise a differential input signal.

14. The apparatus according to claim 1, wherein (i) said first auto-zero stage said second auto-zero stage may each perform auto-zeroing, (ii) said auto-zeroing may tune idle-to-active timing and (iii) tuning said idle-to-active timing reduce idle power consumption.

15. The apparatus according to claim 14, wherein said tuning is implemented by leaving one of said first half-cell or said second half-cell in a mode of operation that performs said calibration.

16. The apparatus according to claim 1, wherein (i) said first half-cell and said second half-cell are each configured to alternate between one of (a) a signal mode of operation and (b) a calibration mode of operation, (ii) said signal mode of operation is configured to transmit data and (iii) said calibration mode of operation is configured to perform said calibration.

17. The apparatus according to claim 16, wherein said first half-cell enters said signal mode of operation for a brief amount of time before said second half-cell exits said signal mode of operation to enable continuous data transmission.

18. The apparatus according to claim 16, wherein (i) said first half-cell is configured to sample a first voltage offset between said first input signal and a reference voltage in said calibration mode of operation and (ii) said second half-cell is configured to sample a volt is configured to sample a second voltage offset between said second input signal and said reference voltage in said calibration mode of operation.

19. The apparatus according to claim 18, wherein said calibration mode of operation is configured to last for an amount of time for either said first auto-zero stage or said second auto-zero stage to settle to a correct voltage level.

* * * * *